United States Patent
Jeon et al.

(10) Patent No.: US 7,777,524 B2
(45) Date of Patent: Aug. 17, 2010

(54) HIGH VOLTAGE SEMICONDUCTOR DEVICE HAVING SHIFTERS AND METHOD OF FABRICATING THE SAME

(75) Inventors: Chang-ki Jeon, Gimpo-si (KR); Min-suk Kim, Bucheon-si (KR); Yong-cheol Choi, Paju-si (KR)

(73) Assignee: Fairchild Korea Semiconductor, Ltd., Bucheon-si (KR)

( * ) Notice: Subject to any disclaimer, the term of this patent is extended or adjusted under 35 U.S.C. 154(b) by 0 days.

(21) Appl. No.: 12/402,528

(22) Filed: Mar. 12, 2009

(65) Prior Publication Data

US 2009/0243696 A1 Oct. 1, 2009

(30) Foreign Application Priority Data

Mar. 28, 2008 (KR) .................... 10-2008-0029322

(51) Int. Cl.
  *H03K 19/0175* (2006.01)
(52) U.S. Cl. ................. 326/80; 326/81; 326/62; 326/101
(58) Field of Classification Search ........... None
See application file for complete search history.

(56) References Cited

U.S. PATENT DOCUMENTS

| 5,446,300 | A | * | 8/1995 | Amato et al. | ............ 257/343 |
| 7,655,979 | B2 | * | 2/2010 | Jeon et al. | ............ 257/335 |
| 2007/0075363 | A1 | * | 4/2007 | Otake et al. | ............ 257/335 |

* cited by examiner

*Primary Examiner*—Anh Q Tran
(74) *Attorney, Agent, or Firm*—Thomas R. FitzGerald; Hiscock & Barclay, LLP

(57) ABSTRACT

Provided are a high-voltage semiconductor device including a junction termination which electrically isolates a low voltage unit from a high voltage unit, and a method of fabricating the same. The high voltage semiconductor device includes a high voltage unit, a low voltage unit surrounding the high voltage unit, and a junction termination formed between the high voltage unit and the low voltage unit and surrounding the high voltage unit to electrically isolate the high voltage unit from the low voltage unit. The junction termination includes at least one level shifter which level shifts signals from the low voltage unit and supplies the same to the high voltage unit, a first device isolation region surrounding the high voltage unit to electrically isolate the high voltage unit from the level shifter, and a resistor layer electrically connecting neighboring level shifters.

21 Claims, 24 Drawing Sheets

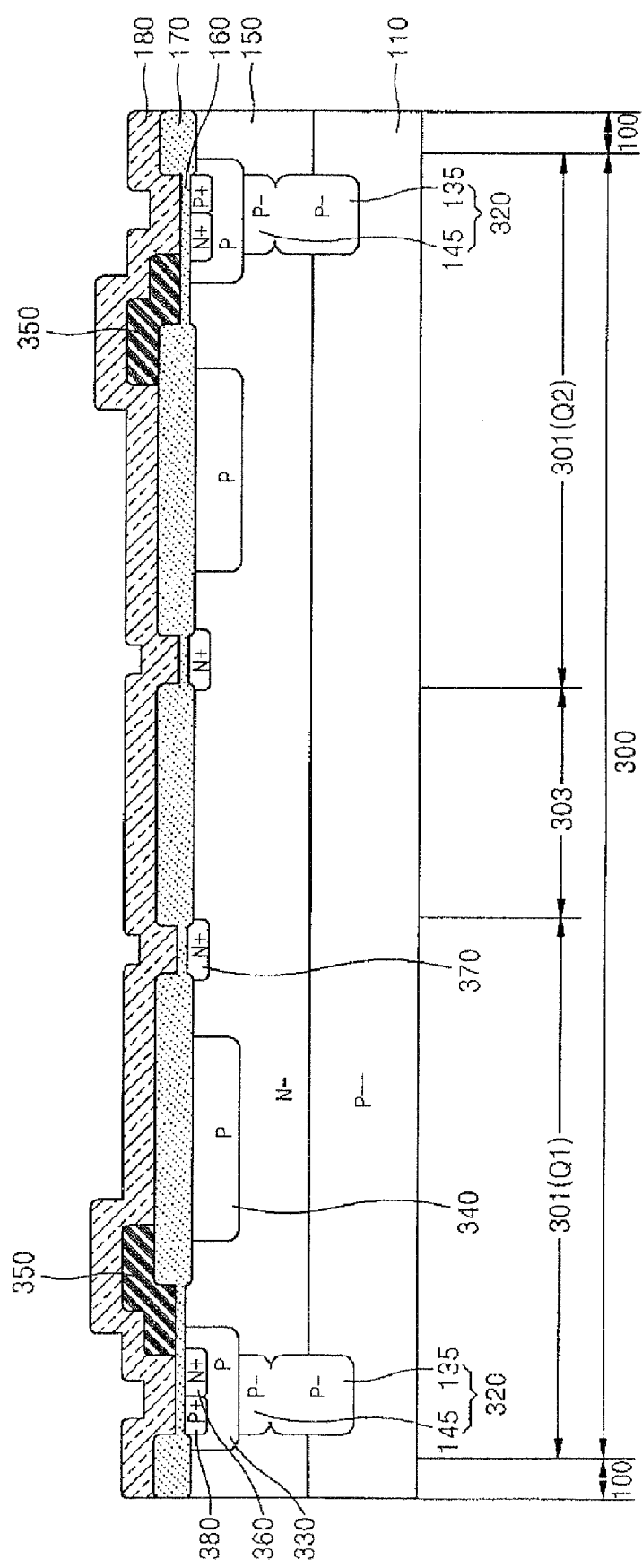

US 7,777,524 B2

HIGH VOLTAGE SEMICONDUCTOR DEVICE HAVING SHIFTERS AND METHOD OF FABRICATING THE SAME

CROSS-REFERENCE TO RELATED PATENT APPLICATION

This application claims the benefit of Korean Patent Application No. 10-2008-0029322, filed on Mar. 28, 2008, in the Korean Intellectual Property Office, the disclosure of which is incorporated herein in its entirety by reference.

BACKGROUND OF THE INVENTION

1. Field of the Invention

The present invention relates to a high voltage semiconductor device having level shifters, and more particularly, to a high voltage semiconductor device in which lateral diffusion metal oxide semiconductor (LDMOS) transistors for level shift are electrically isolated from a high voltage unit, and a method of fabricating the same.

2. Description of the Related Art

High voltage integrated circuits (HVICs) in which at least one high voltage transistor and low voltage circuits are arranged on a single chip are widely used in power control systems such as switching power supplies and motor drivers. An HVIC includes a high voltage unit, a low voltage unit, and a junction termination between the high voltage unit and the low voltage unit. In the junction termination, which isolates the high voltage unit from the low voltage unit, level shifters, which level shift signals from the low voltage unit and supply the same to the high voltage unit, are arranged.

Lateral diffusion metal oxide semiconductor (LDMOS) transistors are used as the level shifter. A high break down voltage and a low on-resistance are required in the LDMOS transistor, and can be obtained by employing a reduced surface field (RESURF) technique.

However, noise such as a cross talk occurs between a high voltage unit and lateral diffusion metal oxide semiconductor (LDMOS) transistors, in a conventional high voltage semiconductor device in which the LDMOS transistors are arranged in a junction termination as level shifters since the high voltage unit is not electrically isolated from the LDMOS transistors.

SUMMARY OF THE INVENTION

Accordingly, the present invention provides a high voltage semiconductor device including level shifters inhibiting cross talks and a method of fabricating the same.

According to an aspect of the present invention, there is provided a high voltage semiconductor device comprising level shifters. The high voltage semiconductor device includes: a high voltage unit; a low voltage unit surrounding the high voltage unit; and a junction termination formed between the high voltage unit and the low voltage unit and surrounding the high voltage unit to electrically isolate the high voltage unit from the low voltage unit. The junction termination includes: at least one level shifter which level shifts signals from the low voltage unit and supplies the same to the high voltage unit; a first device isolation region surrounding the high voltage unit to electrically isolate the high voltage unit from the level shifter; and a resistor layer electrically connecting neighboring level shifters.

The first device isolation region may include a $P^-$ type impurity region. The level shifters may include lateral diffusion metal oxide semiconductor (LDMOS) transistors. Drains of the neighboring LDMOS may be electrically connected to each other through the resistor layer.

The high voltage unit may include a resistor region to which a high voltage is applied, wherein the resistor region is electrically connected to the drains of the LDMOS. The junction termination may further include high voltage interconnections which electrically connect the drains of the LDMOS to the resistor region of the high voltage unit.

The junction termination may further include a second device isolation region arranged along the interface between the low voltage unit and the junction termination to electrically isolate the low voltage unit from the level shifter. The second device isolation region may include a $P^-$ type impurity region.

According to another aspect of the present invention, there is provided a high voltage semiconductor device comprising a high voltage unit arranged on a first conductivity type semiconductor substrate, a low voltage unit arranged on the substrate to surround the high voltage unit, and a junction termination arranged on the substrate between the high voltage unit and the low voltage unit. A first conductivity type semiconductor layer is arranged on the substrate. A first device isolation region is arranged on the semiconductor layer to surround the high voltage unit and to electrically isolate the high voltage unit from the level shifter. At least one first conductivity type first body region is arranged in a portion of the junction termination which contacts the low voltage unit. At least one second conductivity type source region is arranged in each of the first body regions. At least one second conductivity-type drain region is formed on the semiconductor layer of the junction termination and spaced from each of the source regions. At least one second body region is formed on the semiconductor layer of the junction termination between each of the first body regions and each of the drain regions. At least one resistor region is formed on the semiconductor layer of the high voltage unit.

According to another aspect of the present invention, there is provided a method of fabricating a high voltage semiconductor device comprising a high voltage unit arranged on a first conductivity type semiconductor substrate, a low voltage unit arranged on the substrate to surround the high voltage unit, and a junction termination arranged on the substrate between the high voltage unit and the low voltage unit having at least one level shifter. A second conductivity type low-concentration semiconductor layer is formed on the substrate. A thin first insulating layer is formed on the semiconductor layer. A first device isolation region arranged in the junction termination to surround the high voltage unit and a second device isolation region arranged in the junction termination along an interface between the low voltage unit and the junction termination are formed. First conductivity type first body regions arranged on the second device isolation region, first conductivity type second body regions arranged on the semiconductor layer of the junction termination and spaced from the first body regions, and resistor regions arranged in the high voltage part and having the same conductivity type as the first and second conductivity types of the high voltage unit are formed. A second insulating layer for device isolation is formed on the semiconductor layer except for portions on which the first insulating layer is formed corresponding portions of the first body regions, portions of the resistor regions and portions of the junction termination and the high voltage unit. Gates are formed on the first and second insulating layers so as to overlap the first body regions and the second body regions. Second conductivity type source regions are formed in each of the first body regions, second conductivity type drain regions are formed on the semiconductor layer of the junction termination between each of the second body regions and the first device isolation region, and second conductivity type high voltage contact regions which are adjoined to the resistor regions are formed on the semiconductor layer of the high voltage unit. First conductivity type source contact regions contacting each of the source regions in each of the first body region, first conductivity type first resistor contact regions in each of the resistor regions, and first conductivity type second resistor contact regions in each of the resistor regions to be spaced from the first resistor contact regions and to be adjoined to the high voltage contact regions, are formed.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
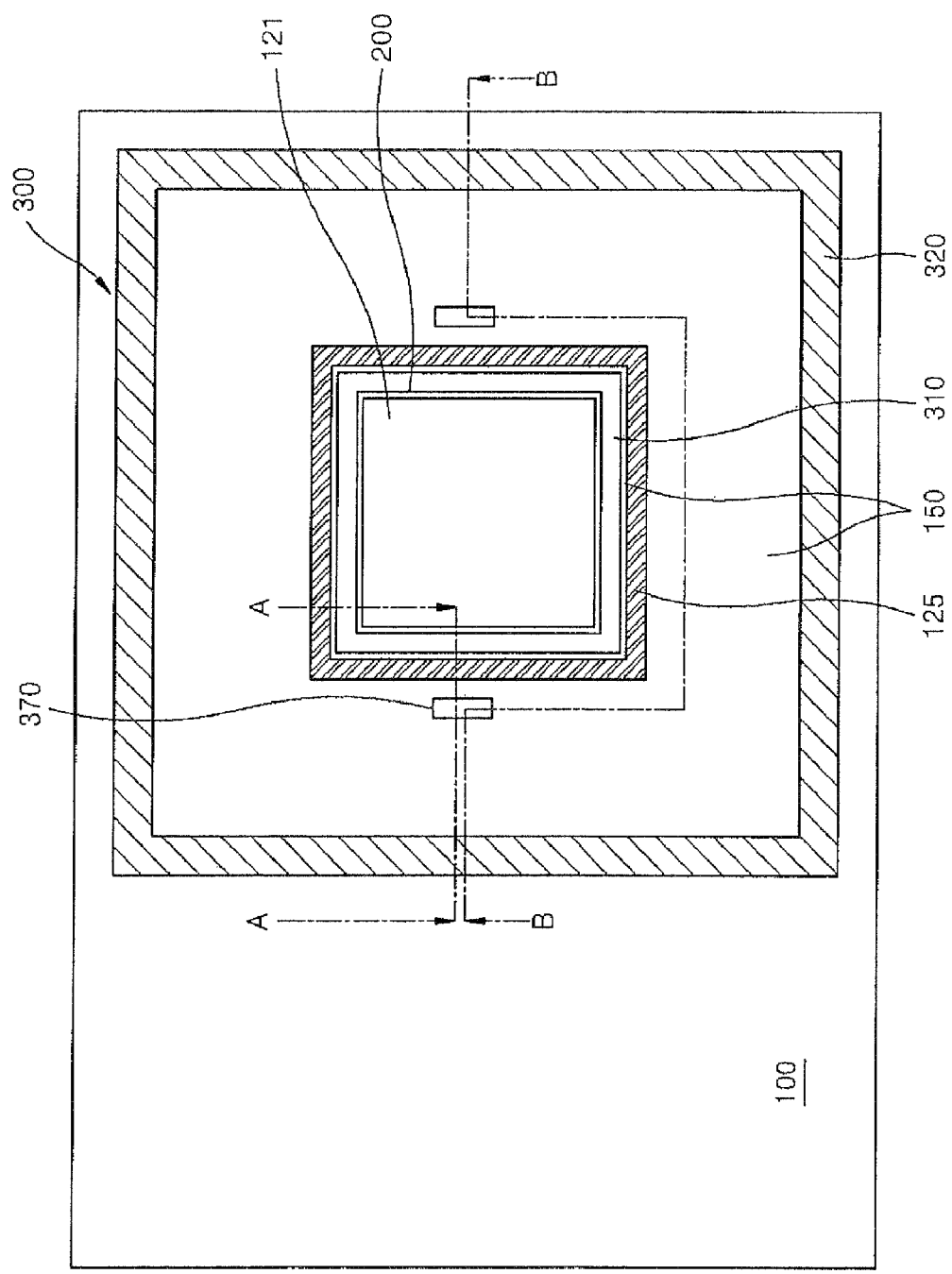
FIG. 1 is a plan view of a high voltage semiconductor device according to an embodiment of the present invention.

Hereinafter, the present invention will now be described more fully with reference to the accompanying drawings, in which exemplary embodiments of the invention are shown. However, the embodiments as described below can be modified in various forms, and the scope of the present invention is not limited to their embodiments. The embodiments of the present invention are provided to fully describe the present invention to those ordinary skilled in the art. Accordingly, in the drawings, the thickness or the size of each component is exaggerated for convenience and clarity, and like reference numerals in the drawings denote like elements.

Figure 2A:
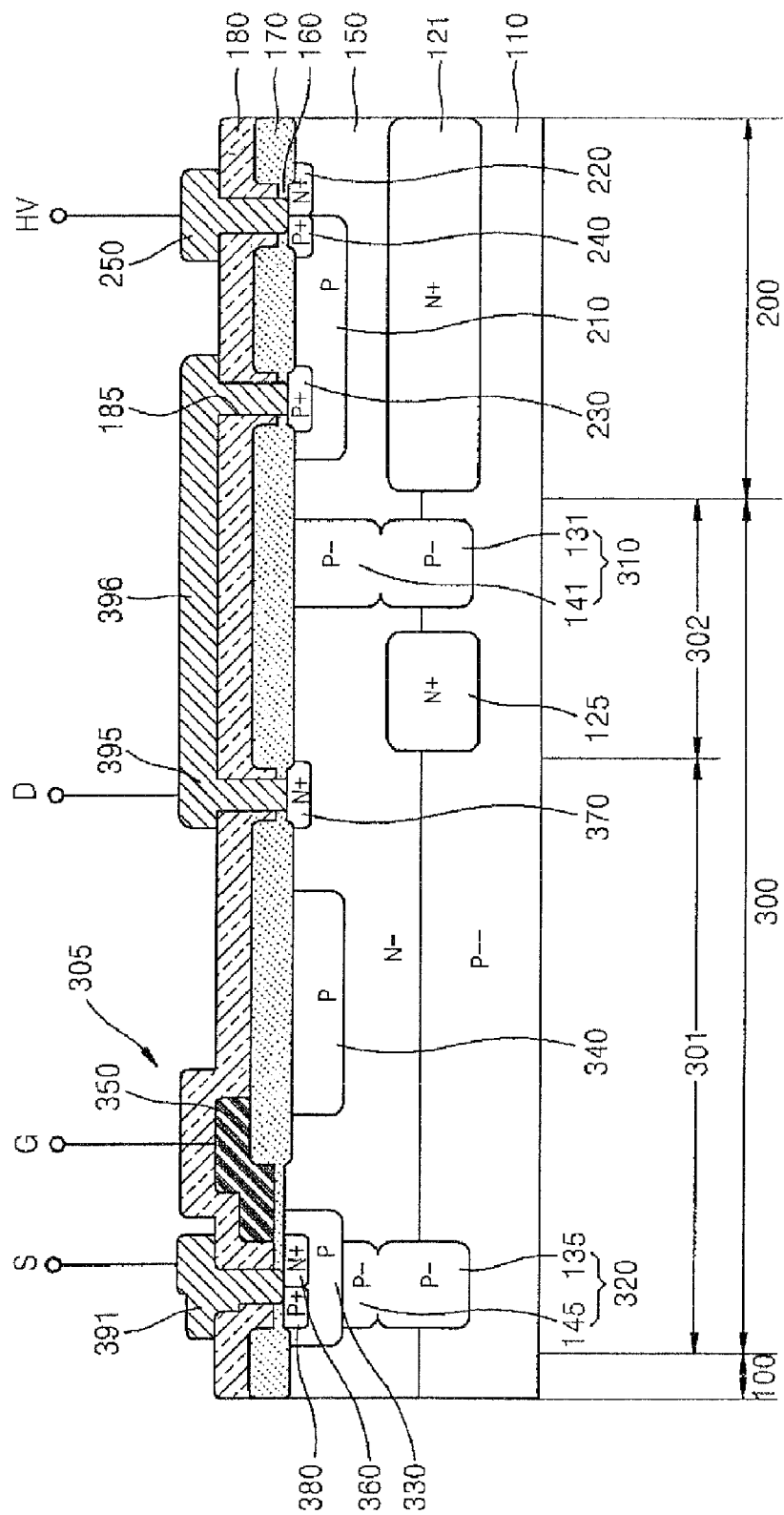
FIG. 2A is a cross-sectional view of the high voltage semiconductor device of FIG. 1, taken along line A-A.
Figure 2B:
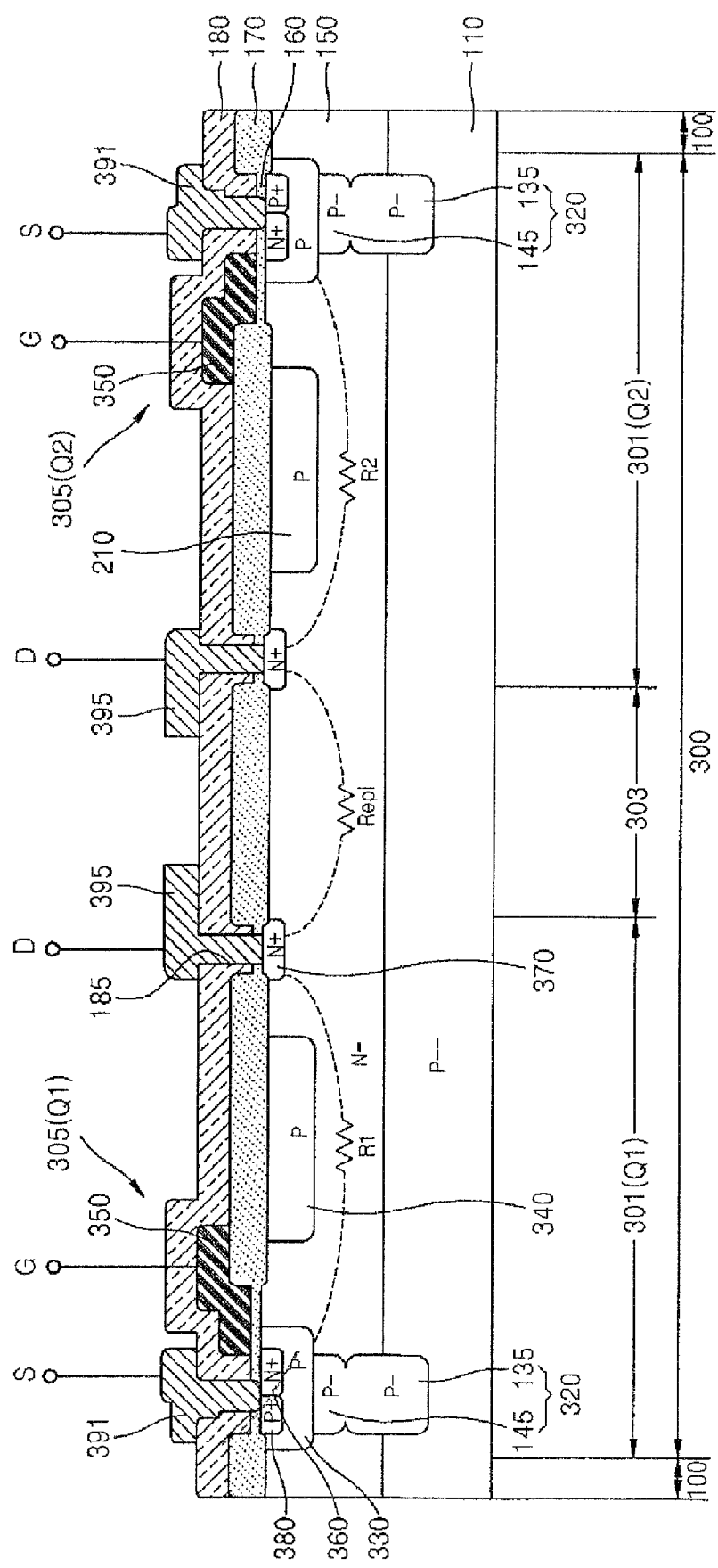
FIG. 2B is a cross-sectional view of the high voltage semiconductor device of FIG. 1, taken along line B-B.

FIG. 1 is a plan view of a high voltage semiconductor device according to an embodiment of the present invention. FIG. 2A is a cross-sectional view of the high voltage semiconductor device of FIG. 1, taken along line A-A. FIG. 2B is a cross-sectional view of the high voltage semiconductor device of FIG. 1, taken along line B-B. Referring to FIGS. 1, 2A and 2B, the high voltage semiconductor device includes a low voltage unit 100 and a high voltage unit 200 surrounded by the low voltage unit 100 and having an island shape. A junction termination 300 is arranged between the low voltage unit 100 and the high voltage unit 200, and includes a device region 301 in which level shifters for transmitting signals S1 and S2 of FIG. 3 from the low voltage unit 100 to the high voltage unit 200 are arranged and a interconnection region 302 in which a high voltage interconnection 396 electrically connecting the device region 301 and the high voltage unit 200 is arranged. The level shifters may each include a lateral diffusion metal oxide semiconductor (LDMOS) transistor 305.

A first device isolation region 310 surrounding the high voltage unit 200 is arranged in the interconnection region 302 to electrically isolate the LDMOS transistors 305 from the high voltage unit 200. The first device isolation region 310 may include a first bottom region 131 arranged at an interface between a semiconductor substrate 110 and an epitaxial layer 150, and a first well region 141 arranged on the first bottom region 131 to the upper surface of the epitaxial layer 150. The first bottom region 131 and the first well region 141 may include a first conductivity type low-concentration impurity, for example, a $P^-$ type impurity region. A second device isolation region 320, which is adjoined to the low voltage unit 100, is arranged in the device region 301 to electrically isolate the low voltage unit 100 from the LDMOS transistors 305. The second device isolation region 320 may include a second bottom region 135 arranged at the interface between the semiconductor substrate 110 and the epitaxial layer 150 and a second well region 145 arranged on the second bottom region 135, in the epitaxial layer 150. The second bottom region 135 and the second well region 145 may include a first conductivity type low-concentration impurity, for example, a $P^-$ type impurity region.

A second conductivity type low-concentration, for example, an $N^-$ type epitaxial layer 150 is formed on the first conductivity type low-concentration, for example, a $P^{--}$ type substrate 110. An $N^+$ type first buried region 121 is arranged at the interface of the substrate 110 and the epitaxial layer 150 of the high voltage unit 200 such that the first device isolation region 310 surrounds the first buried region 121. An $N^+$ type second buried layer 125 is arranged at the interface of the substrate 110 and the epitaxial layer 150 in the interconnection region 302 of the junction termination 300 to surround the first device isolation region 310.

In the device region 301 of the junction termination 300, a P type first body region 330 is formed on the second well region 145, and a second conductivity type high-concentration, for example, an $N^+$ type source region 360 is formed in the first body region 330. A first conductivity type high-concentration, for example, a $P^+$ type first contact region 380 which contacts the source region 360 is formed in the first body region 330. The first contact region 380 may include the source contact region 360. A second conductivity type high-concentration region, for example, an $N^+$ type drain region 370 which is spaced from the source region 360 is formed in the epitaxial layer 150 of the device region 301. A P type second body region 340 is arranged between the source region 360 and the drain region 370 in the epitaxial layer 150 of the device region 301.

A P type third body region 210 is formed in the epitaxial layer 150 of the high voltage unit 200. The third body region 210 may function as a resistor region which connects the drain region 370 of the LDMOS transistor 305 to the high voltage unit 200. A third contact region 230 and a fourth contact region 240, which is spaced from the third contact region 230, are arranged in the third body region 210. The third and fourth contact regions 230 and 240 may include $P^+$ type impurity regions. The third contact region 230 may include a first resistor contact region, and the fourth contact region 240 may include a second resistor contact region. A second contact region 220 which is adjoined to the fourth contact region 240 is formed in the epitaxial layer 150 of the high voltage unit 200. The second contact region 220 may include an $N^+$ type impurity region.

A thin first insulating layer 160 is formed on the epitaxial layer 150 corresponding to the first body region 330, a portion between the first and second body regions 330 and 340, the drain region 370, and the second to fourth contact regions 220, 230 and 240. A thick second insulating layer 170, for device isolation, is formed on the epitaxial layer 150 except for portions on which the first insulating layer 160 is formed. A gate 350 is formed on a portion of the first insulating layer 160 and a portion of the second insulating layer 170 to overlap a portion of the first source region 330 and a portion of the first body region 340. The first insulating layer 160 between the gate 350 and the epitaxial layer 150 may function as a gate insulating layer.

An interlayer insulating layer 180 is formed on the top surface of the substrate, and includes contact holes 185 which expose portions of the first contact region 380 and the source region 360, a portion of the third contact region 230, a portion of the drain region 370 and portions of the fourth contact region 240 and the second contact region 220. A source electrode 391 which is electrically connected to the first contact region 380 and the source region 330 through the contact holes 185 is formed on the interlayer insulating layer 180 of the low voltage unit 100. A drain electrode 395 which electrically contacts the drain region 370 is formed on the interlayer insulating layer 180 in the device region 301 and the interconnection region 302. The high voltage interconnection 396 which extends from the drain electrode 395 and contacts the third contact region 230 of the high voltage unit 200 is formed on the interlayer insulating layer 180. The high voltage interconnection 396 extends from the drain electrode 395 of the LDMOS transistor 305 to the third contact region 230 to transmit the signals S1 and S2 from the low voltage unit 100 to the high voltage unit 200. A high voltage interconnection electrode 250 is formed on the interlayer insulating layer 180 of the high voltage unit 200 so as to electrically contact the second and fourth contact regions 220 and 240. The high voltage interconnection electrode 250 may supply a high voltage HV to the fourth contact region 240.

Figure 3:
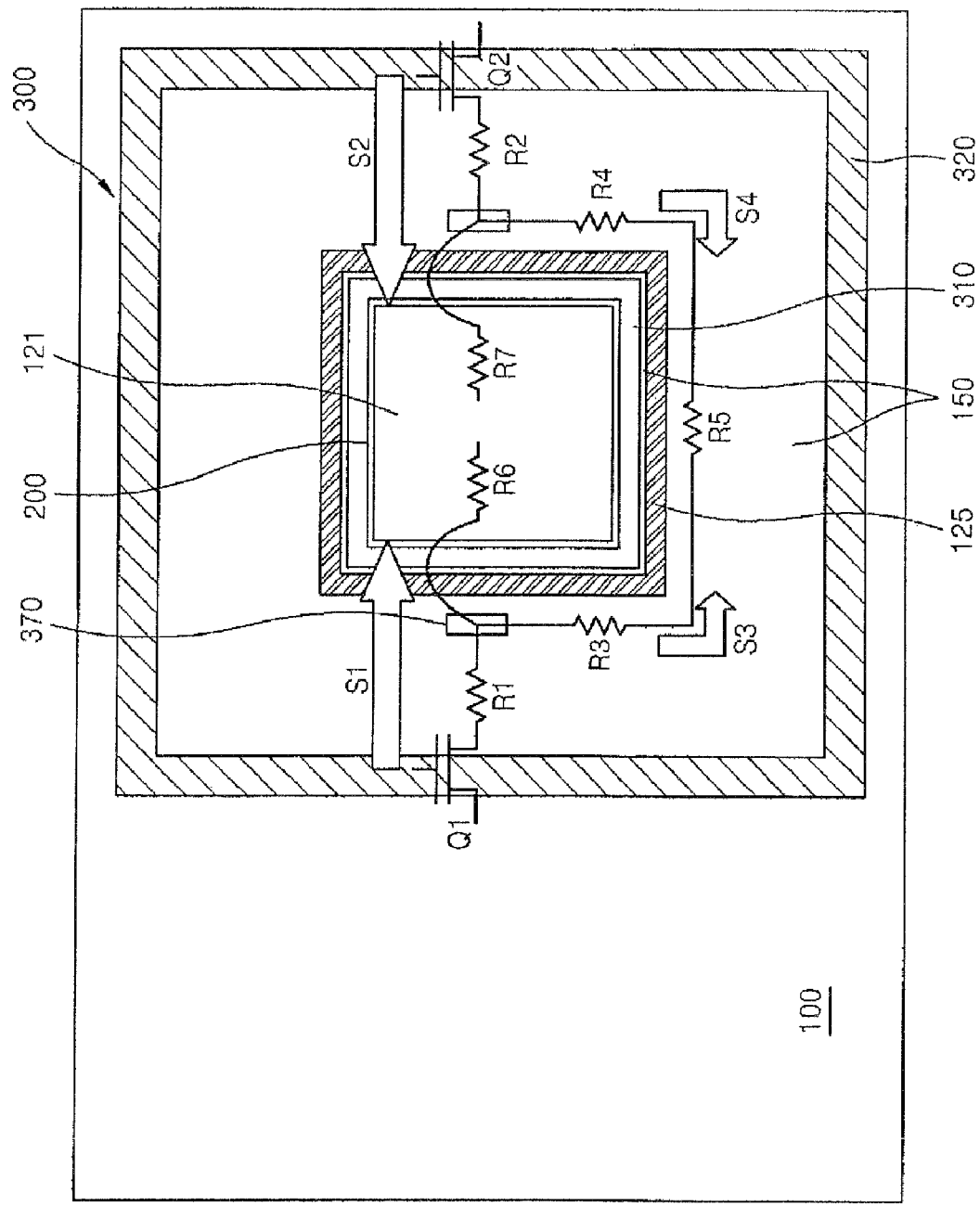
FIG. 3 is a cross-sectional view of the high voltage semiconductor device of FIG. 1, illustrating operation of level shifting signals from a low voltage unit to a high voltage unit.

FIG. 3 is a cross-sectional view of the high voltage semiconductor device of FIG. 1, describing an operation of level shifting signals from the low voltage unit 100 to the high voltage unit 200 in the junction termination 300. Referring to FIGS. 2A, 2B and 3, at least one LDMOS transistor, for example, two LDMOS transistors 305(Q1) and 305(Q2) may be arranged in the junction termination 300. When a gate voltage is applied to the gate 350 of the LDMOS transistors 305(Q1) and 305(Q2) to turn on the LDMOS transistors 305(Q1) and 305(Q2), currents flow from the drain region 370 to the source region 360 in the LDMOS transistors 305(Q1) and 305(Q2). Accordingly, the signals S1 and S2 from the low voltage unit 100 are level shifted and are applied to the high voltage unit 200.

A resistor R1 is an internal resistor between the source region 360 and the drain region 370 of the LDMOS transistor 305(Q1) and a resistor R2 is an internal resistor between the source region 360 and the drain region 370 of the LDMOS transistor 305(Q2). A voltage drop may occur due to the resistors R1 and R2 in the signals S1 and S2 which are transmitted to the high voltage unit 200 through the LDMOS transistors 305(Q1) and 305(Q2). Resistors R6 and R7 are resistors arranged in the high voltage unit 200. The resistors R6 and R7 may be resistors of the third body region 210. The high voltage interconnection electrode 250 of the high voltage unit 200 and the drain electrode 395 of the junction termination 300 may be electrically connected to each other through the resistors R6 and R7.

The high voltage unit 200 is surrounded by the first device isolation region 310 of the junction termination 300 and electrically isolated from the low voltage unit 100. Thus, noise such as a cross talk may be inhibited between the high voltage unit 200 and the LDMOS transistors 305(Q1) and 305(Q2). Meanwhile, the LDMOS transistors 305(Q1) and 305(Q2), which are arranged in the junction termination 300, may be electrically connected to each other in a resistor region 303. The resistor region 303 may include the epitaxial layer 150 between the drain regions 370 of the neighboring LDMOS transistors 305(Q1) and 305(Q2). That is, the drain regions 370 of the neighboring LDMOS transistors 305(Q1) and 305(Q2) may be electrically connected to each other via the epitaxial layer 150 of the resistor region 303. A resistor Repi of the resistor region 303 may include serially connected resistors R3, R4 and R5. Here, although noise signals S3 and S4 are generated in the internal of the device, the noise signals S3 and S4 cannot be transmitted to the neighboring LDMOS transistors 305(Q1) and 305(Q2) due to the resistors R3-R5 of the resistor region 303 so that an interference does not occur in the neighboring LDMOS transistor 305(Q1) and 305(Q2).

FIGS. 4A to 4J are cross-sectional views illustrating a method of fabricating the high voltage semiconductor device of FIG. 2A. FIGS. 5A to 5J are cross-sectional views illustrating the method of fabricating the high voltage semiconductor device of FIG. 2B.

Figure 4A:
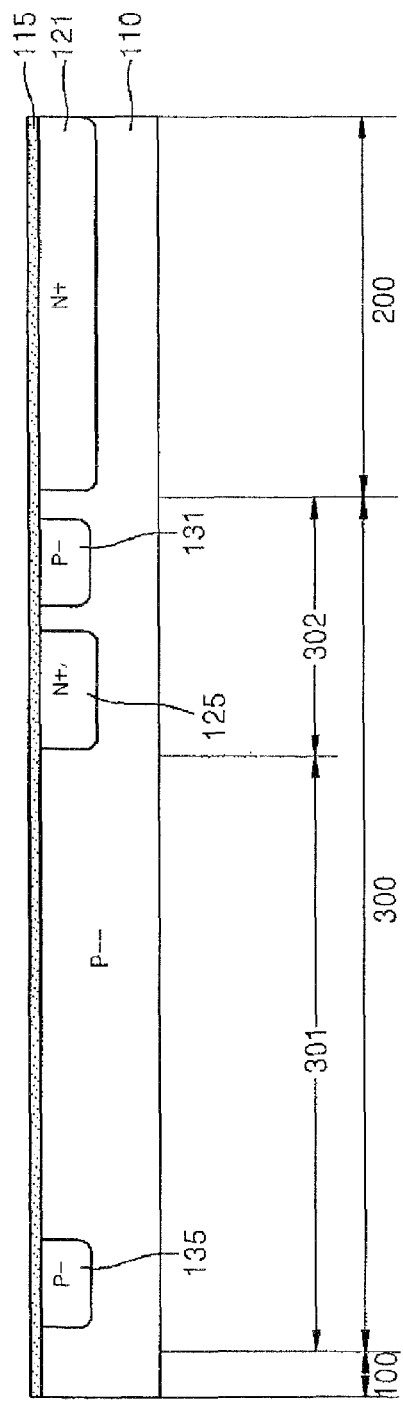
FIGS. 4A to 4J are cross-sectional views illustrating a method of fabricating the high voltage semiconductor device of FIG. 2A, and FIGS. 5A to 5J are cross-sectional views illustrating the method of fabricating the high voltage semiconductor device of FIG. 2B.
Figure 5A:
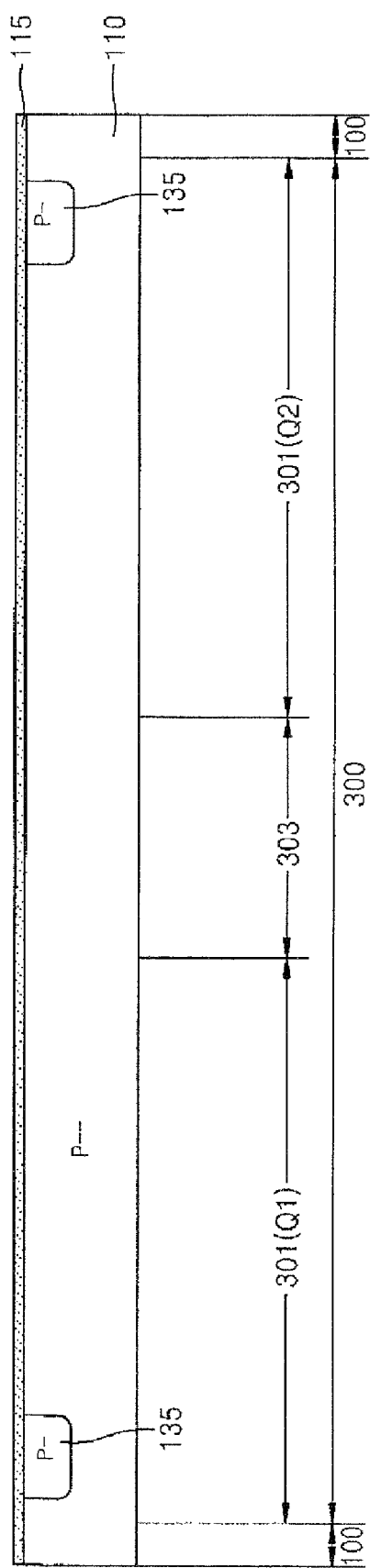

Referring to FIGS. 4A and 5A, a first conductivity type low-concentration substrate, for example, a $P^{--}$ type semiconductor substrate 110 is prepared. A first insulating layer 115 is formed on the $P^{--}$ type semiconductor substrate 110. The first insulating layer 115 may include a pad oxide layer which is formed through a thermal oxidation process. A first photosensitive layer (not shown) is formed on the first insulating layer 115. The first photosensitive layer may be formed so as to expose a portion of the first insulating layer 115 on which buried layers will be formed. Second conductivity type high-concentration impurity ions are implanted into the substrate 110 using the first photosensitive layer as a mask to form the $N^+$ type first buried region 121 in the high voltage unit 200 and the $N^+$ type second buried layer 125 in the interconnection region 302 of the junction termination 300. The $N^+$ type second buried layer 125 may be formed to surround the first buried region 121 of the high voltage unit 200.

Then, a second photosensitive layer (not shown) is formed on the first insulating layer 115 after removing the first photosensitive layer. The second photosensitive layer may be formed so as to expose a portion of the first insulating layer 115 on which bottom regions for device isolation will be formed. First conductivity type low-concentration impurity ions, for example, $P^-$ type impurity ions are implanted into the substrate 110 using the second photosensitive layer as a mask to form the P– type first bottom region 131 in the interconnection region 302 and the $P^-$ type second bottom region 135 in the device region 301, such that the P– type first bottom region 131 is between the first buried region 121 and the second buried layer 125, and the $P^-$ type second bottom region 135 is along the interface of the low voltage unit 100 and the junction termination 300.

Figure 4B:
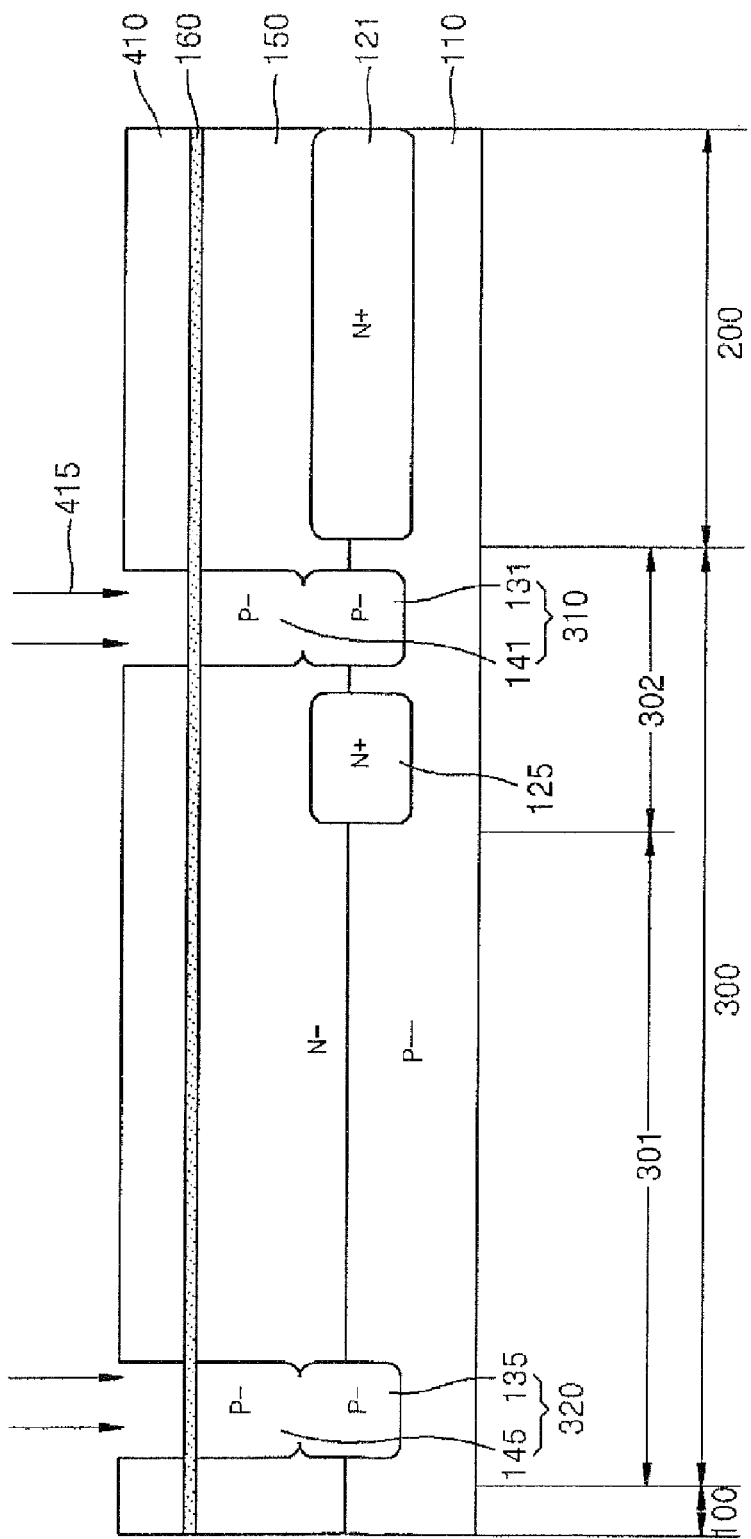
Figure 5B:
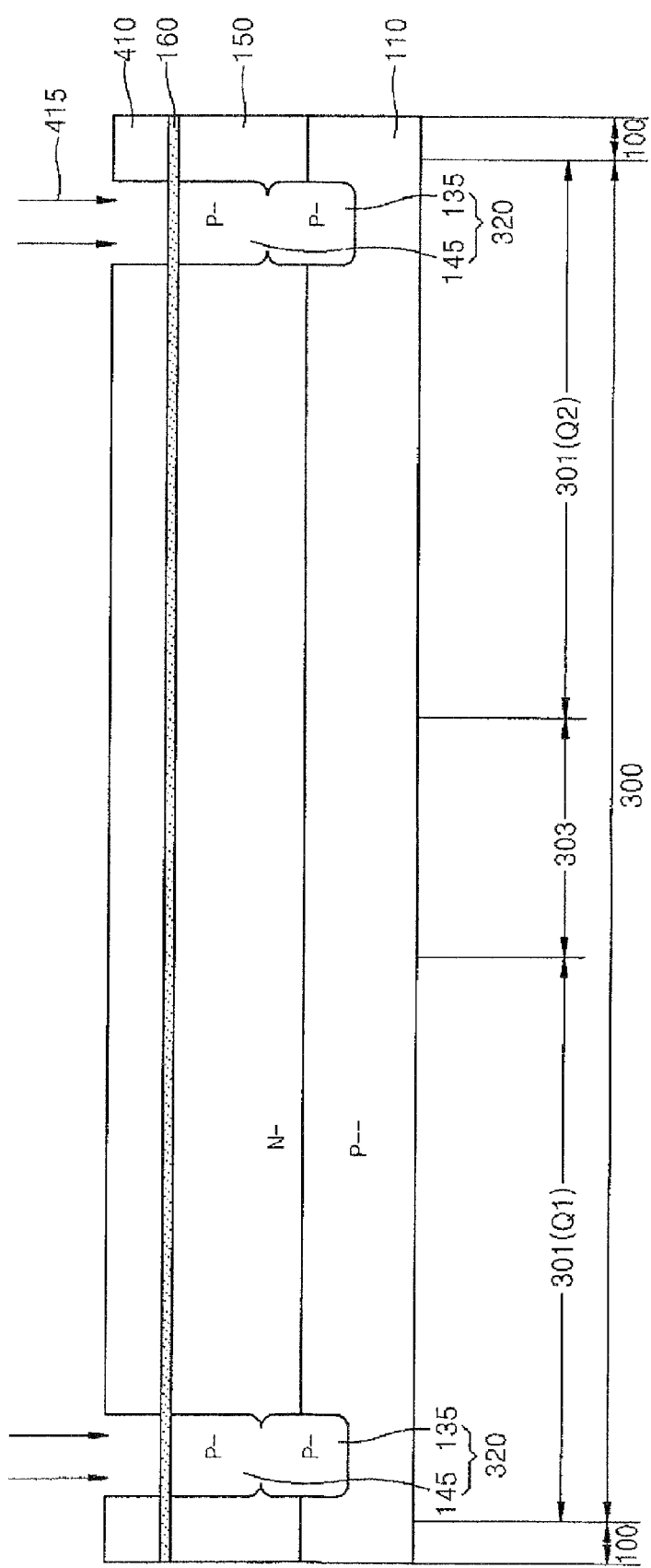

Referring to FIGS. 4B and 5B, the second photosensitive layer is removed and then the first insulating layer 115 is removed. A second conductivity type low-concentration, for example, the $N^-$ type epitaxial layer 150 is formed on the $P^{--}$ type semiconductor substrate 110. A thin second insulating layer 160 is formed on the $N^-$ type epitaxial layer 150. The second insulating layer 160 may include a pad oxide layer formed through a thermal oxidation process. A third photosensitive layer 410 is formed on the second insulating layer 160. The third photosensitive layer 410 may be formed so as to expose portions of the second insulating layer 160 that correspond to the first and second bottom regions 131 and 135.

Then, first conductivity type low-concentration impurity ions 415 are implanted into the epitaxial layer 150 by using the third photosensitive layer 410 as a mask to form the P⁻ type first well region 141 on the first bottom region 131 and the P⁻ type second well region 145 on the second bottom region 135. Thus, the first device isolation region 310 including the first bottom region 131 and the first well region 141 is formed to surround the high voltage unit 200, and the second device isolation region 320 including the second bottom region 135 and the second well region 145 is arranged in the device region 301, along the interface of the junction termination 300 and the low voltage region 100.

Figure 4C:
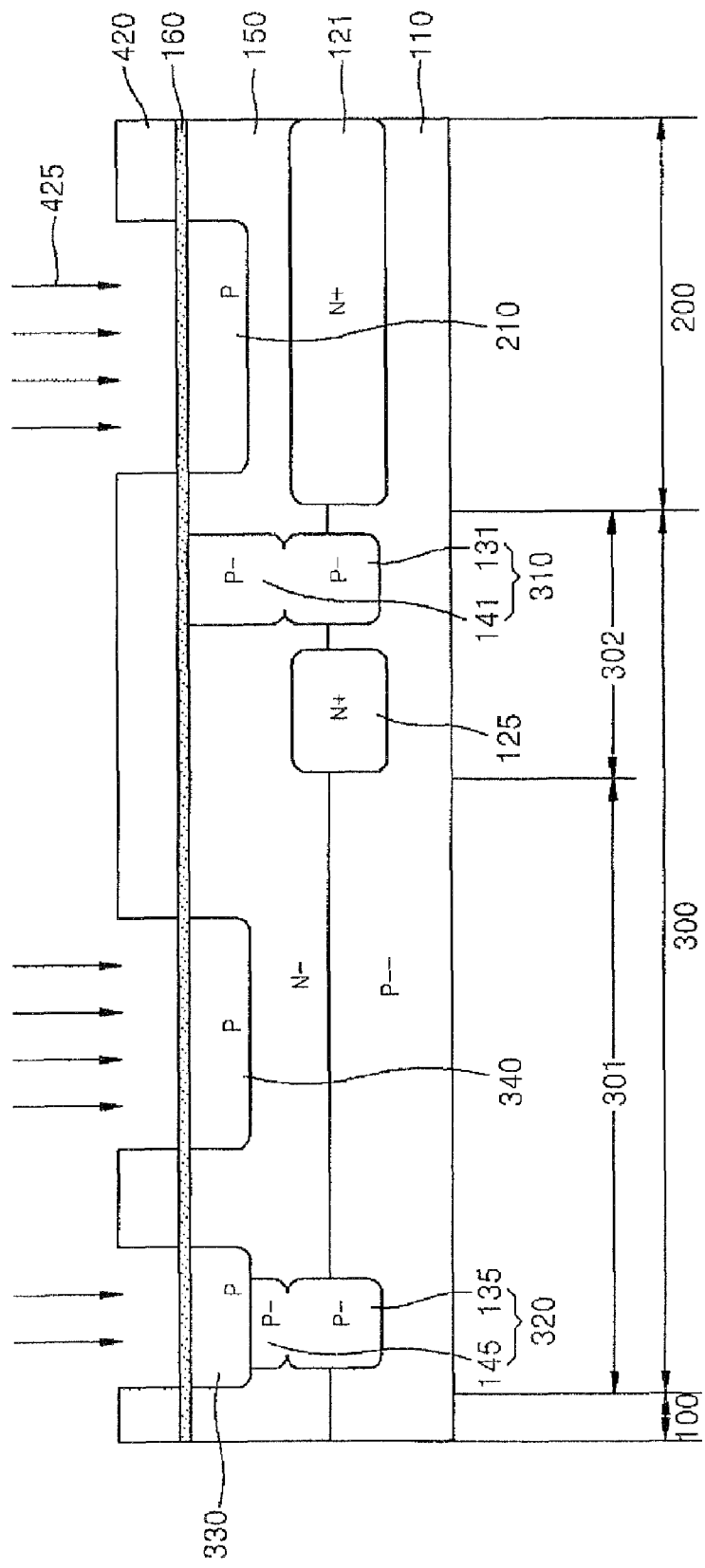
Figure 5C:
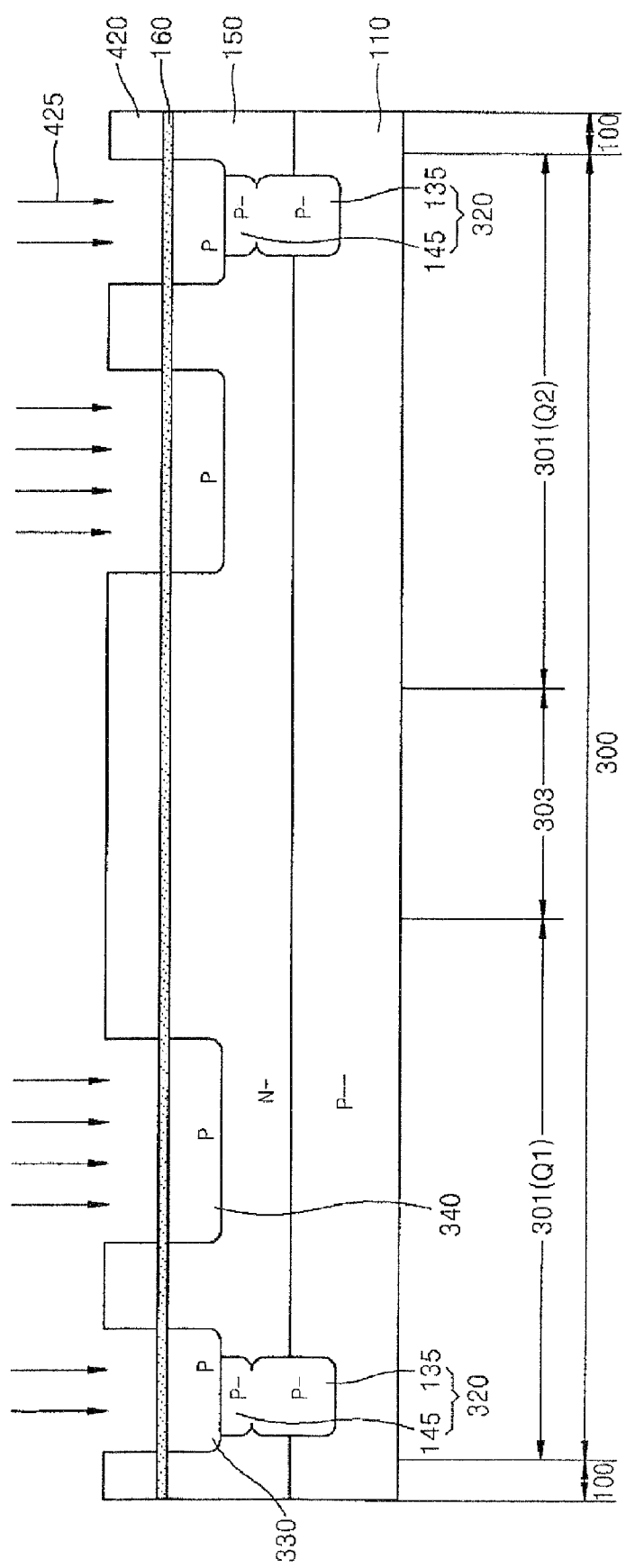

Referring to FIGS. 4C and 5C, the third photosensitive layer 410 is removed and a fourth photosensitive layer 420 is formed on the second insulating layer 160. The fourth photosensitive layer 420 may be formed so as to expose portions of the second insulating layer 160 corresponding to portions where the body regions are to be formed. Second conductivity type impurity ions 425 are implanted into the epitaxial layer 150 using the fourth photosensitive layer 420 as a mask. Thus, the P type first body region 330 is formed on the second well region 145 of the device region 301, and the P type second body region 340 is spaced from the first body region 330 and is formed in the epitaxial layer 150 of the device region 301. In addition, the P type third body region 210 is formed in the epitaxial layer 150 of the high voltage unit 200. The third body region 210 may include a resistor region arranged in the high voltage unit 200.

Figure 4D:
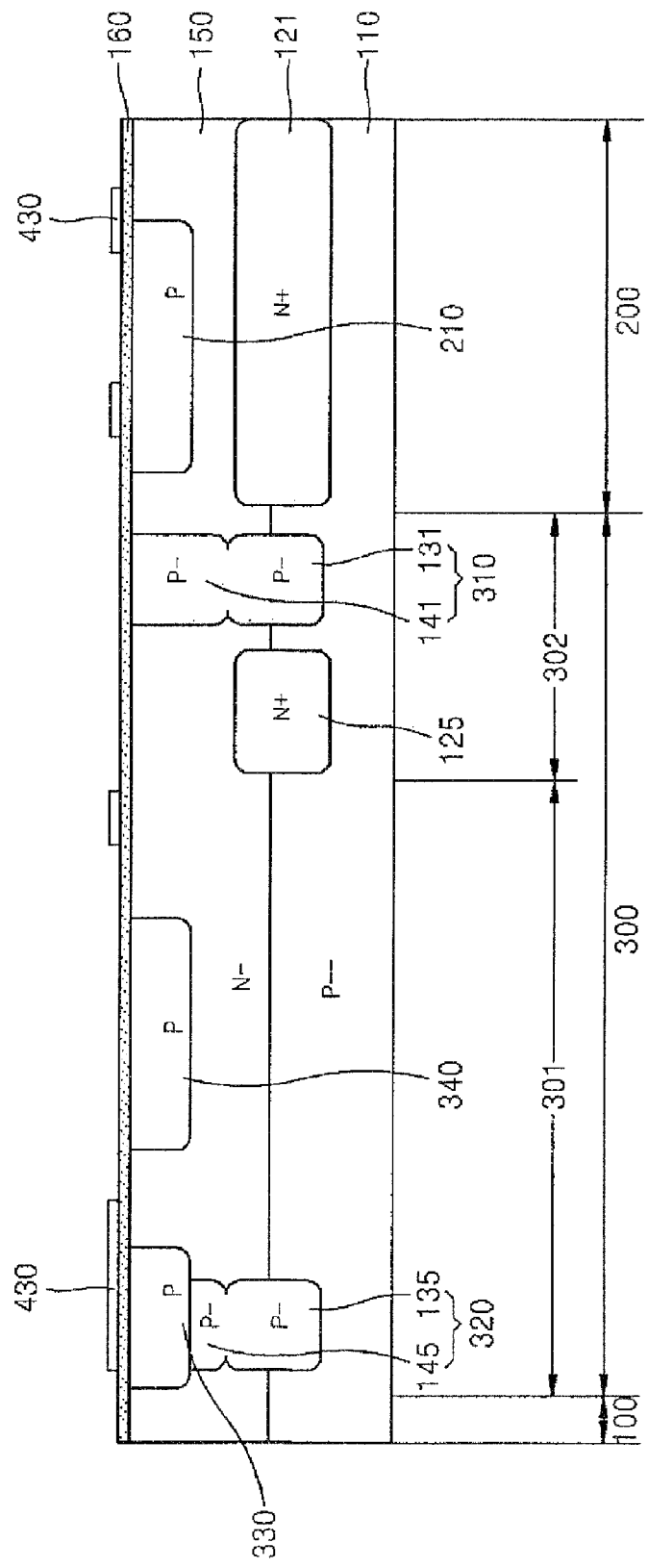
Figure 4E:
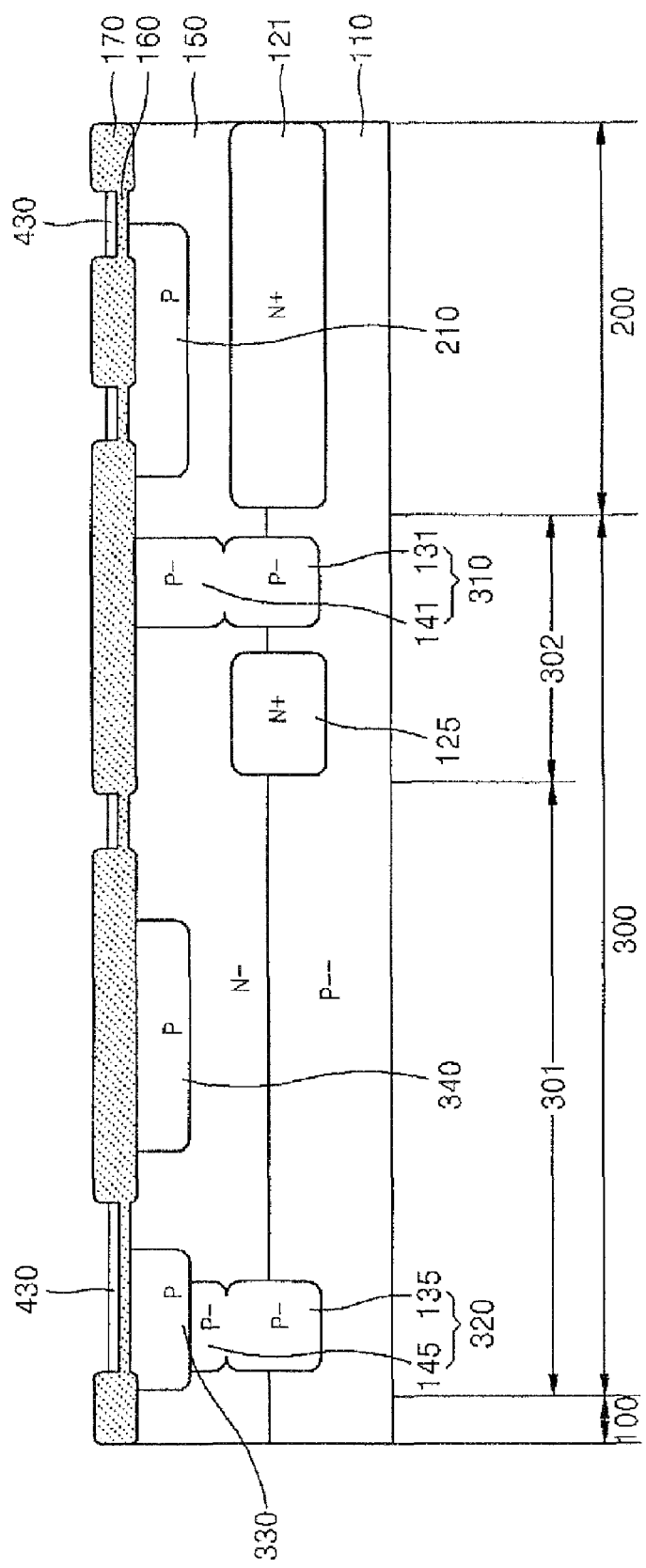
Figure 5D:
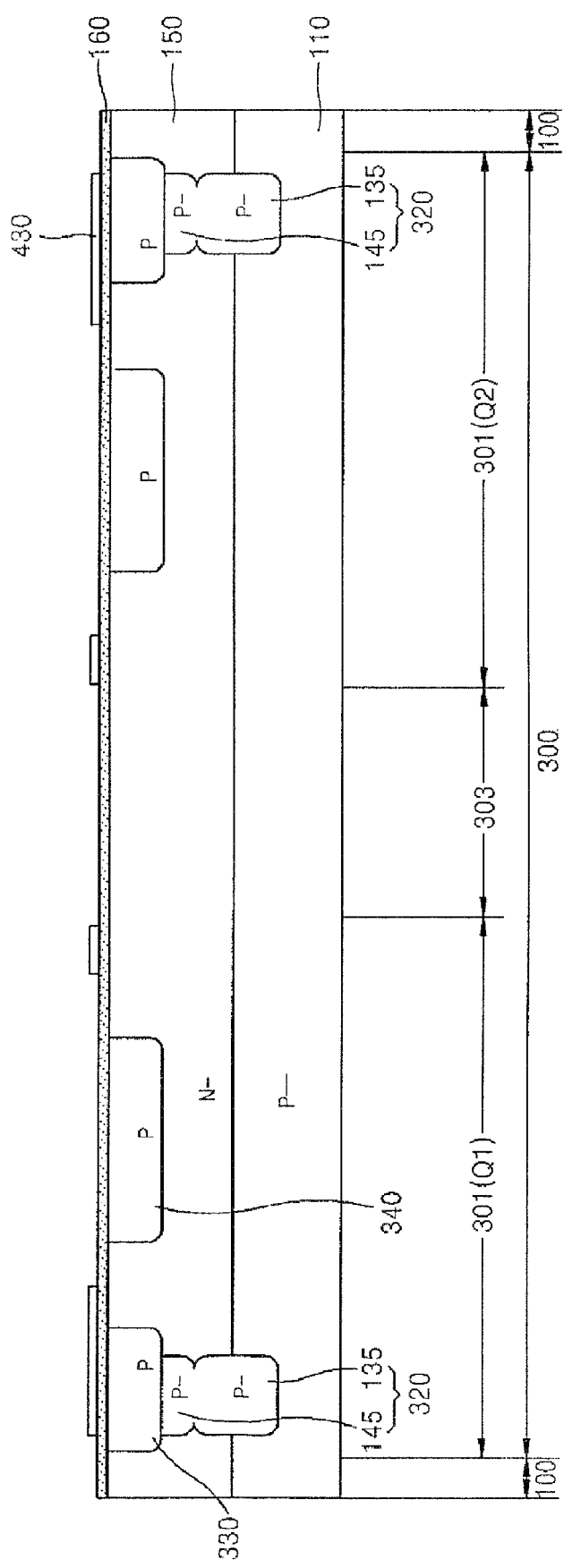
Figure 5E:
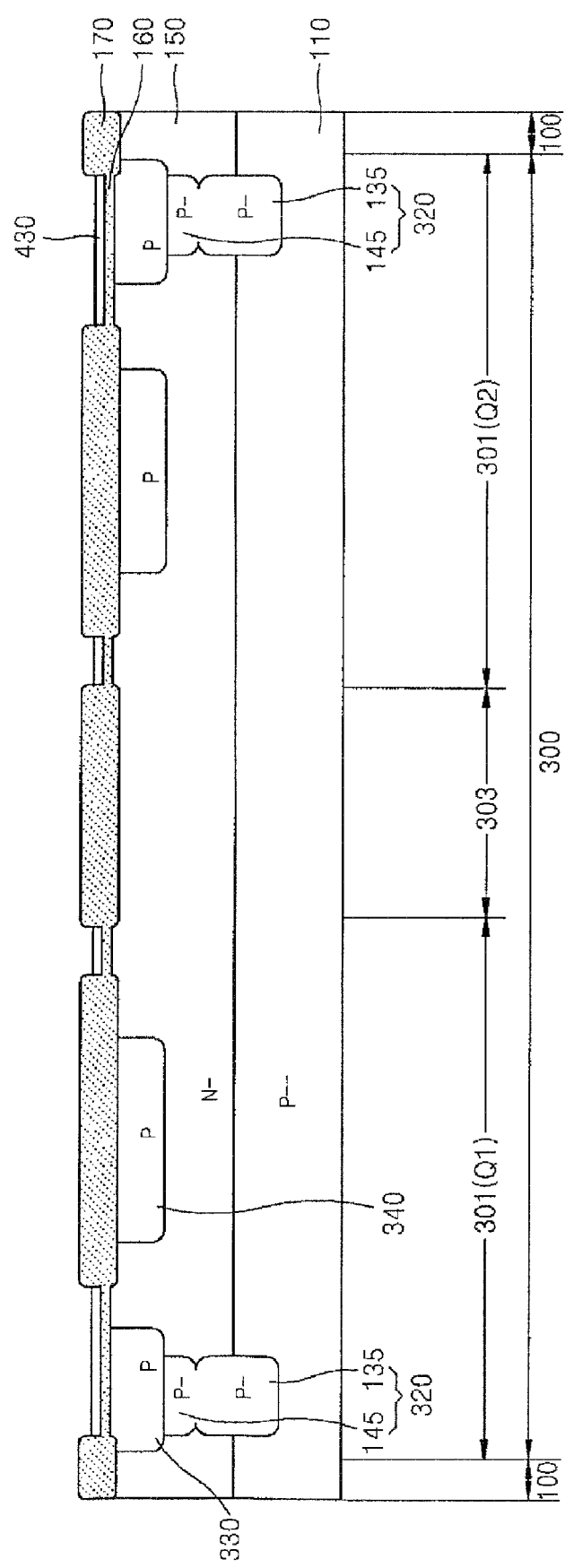

Referring to FIGS. 4D and 5D, the fourth photosensitive layer 420 is removed, and a nitride layer 430 for an oxidation mask is formed on the second insulating layer 160. The nitride layer 430 is patterned so as to expose a portion of the second insulating layer 160 on which a device isolation layer will be formed. Referring to FIGS. 4E and 5E, a thick third insulating layer 170 is formed on the epitaxial layer 150 through a LOCOS process. The third insulating layer 170 is formed on the epitaxial layer 150, except for portions in which contact holes will be formed during subsequent processes and a portion corresponding to the gate insulating layer.

Figure 4F:
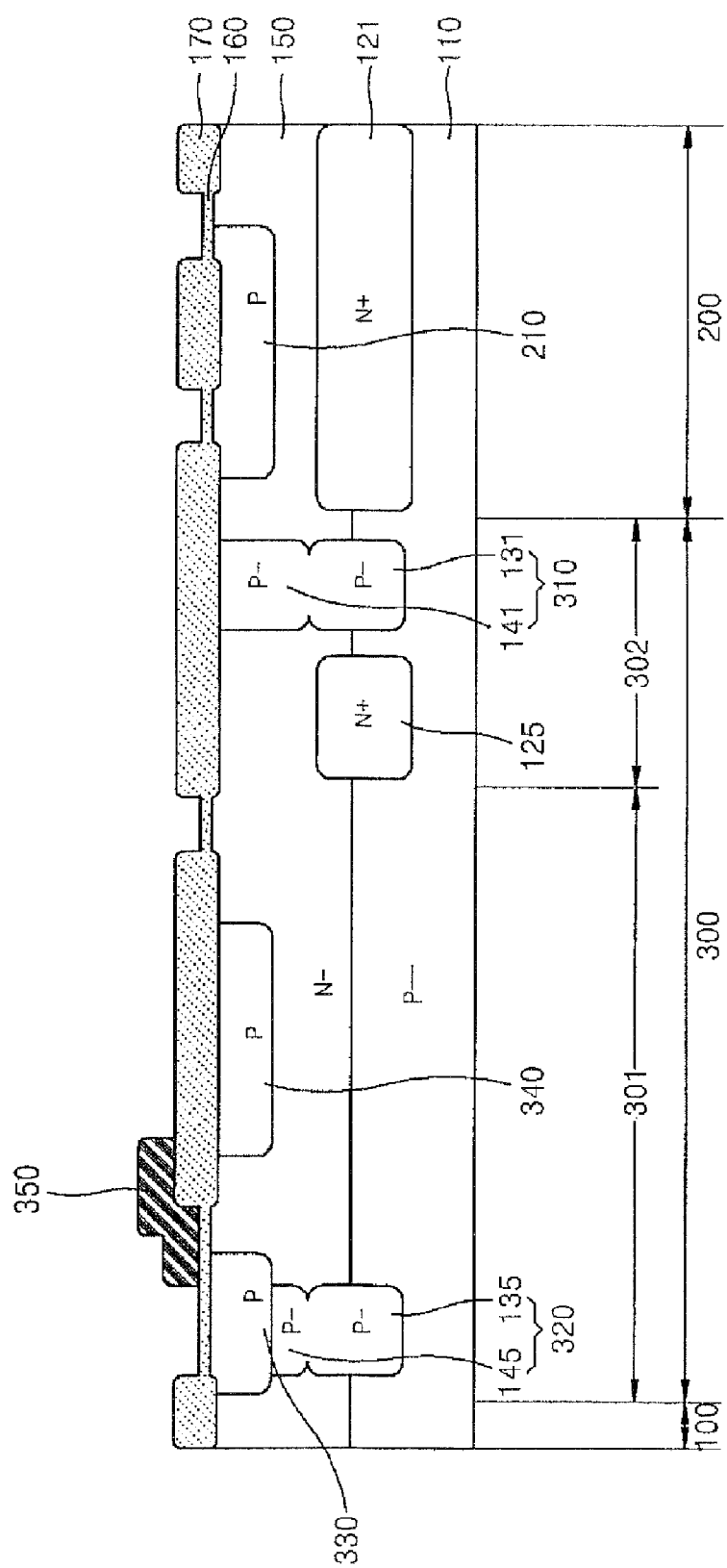
Figure 5F:
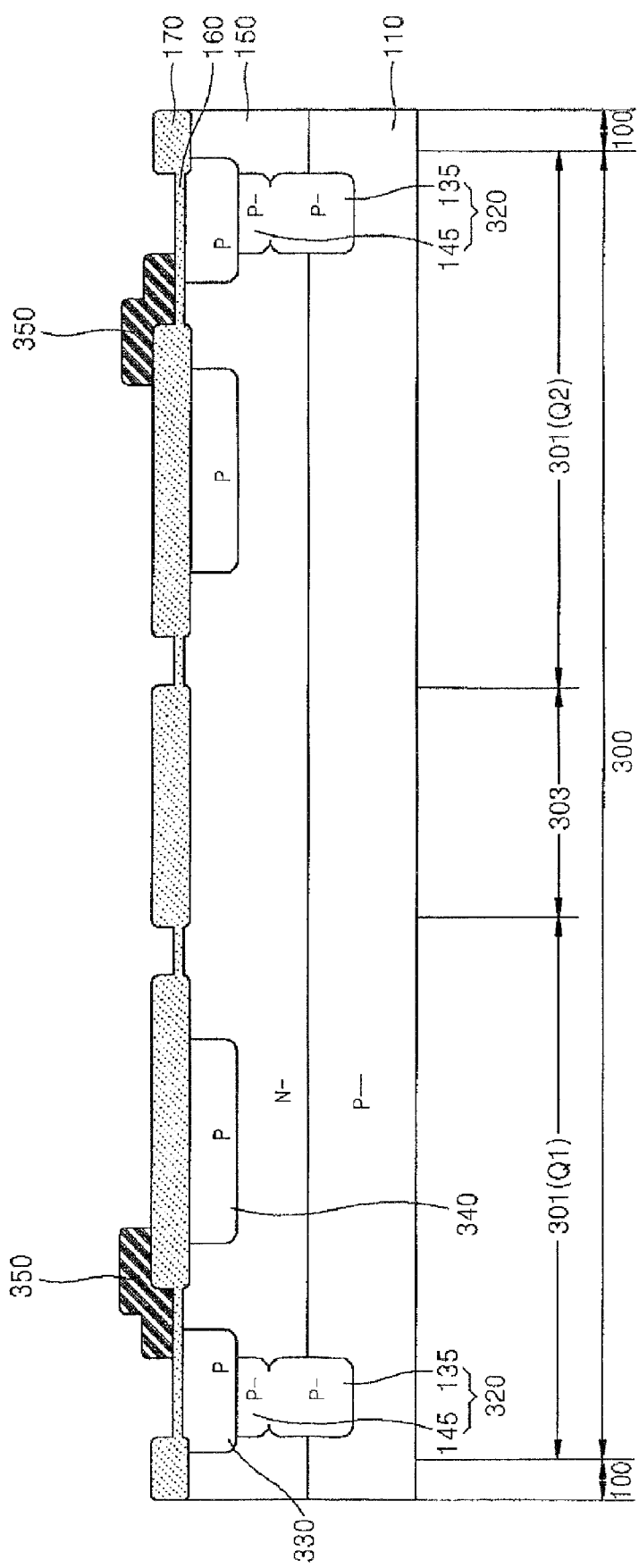

Referring to FIGS. 4F and 5F, the nitride layer 430 is removed and a conductive layer is deposited on the second insulating layer 160 and the third insulating layer 170. The conductive layer is patterned so as to form the gate 350 on the second insulating layer 160 and the third insulating layer 170 of the device region 301. The gate 350 is formed to overlap the first body region 330 and the second body region 340. The conductive layer for the gate 350 may include a polysilicon layer.

Figure 4G:
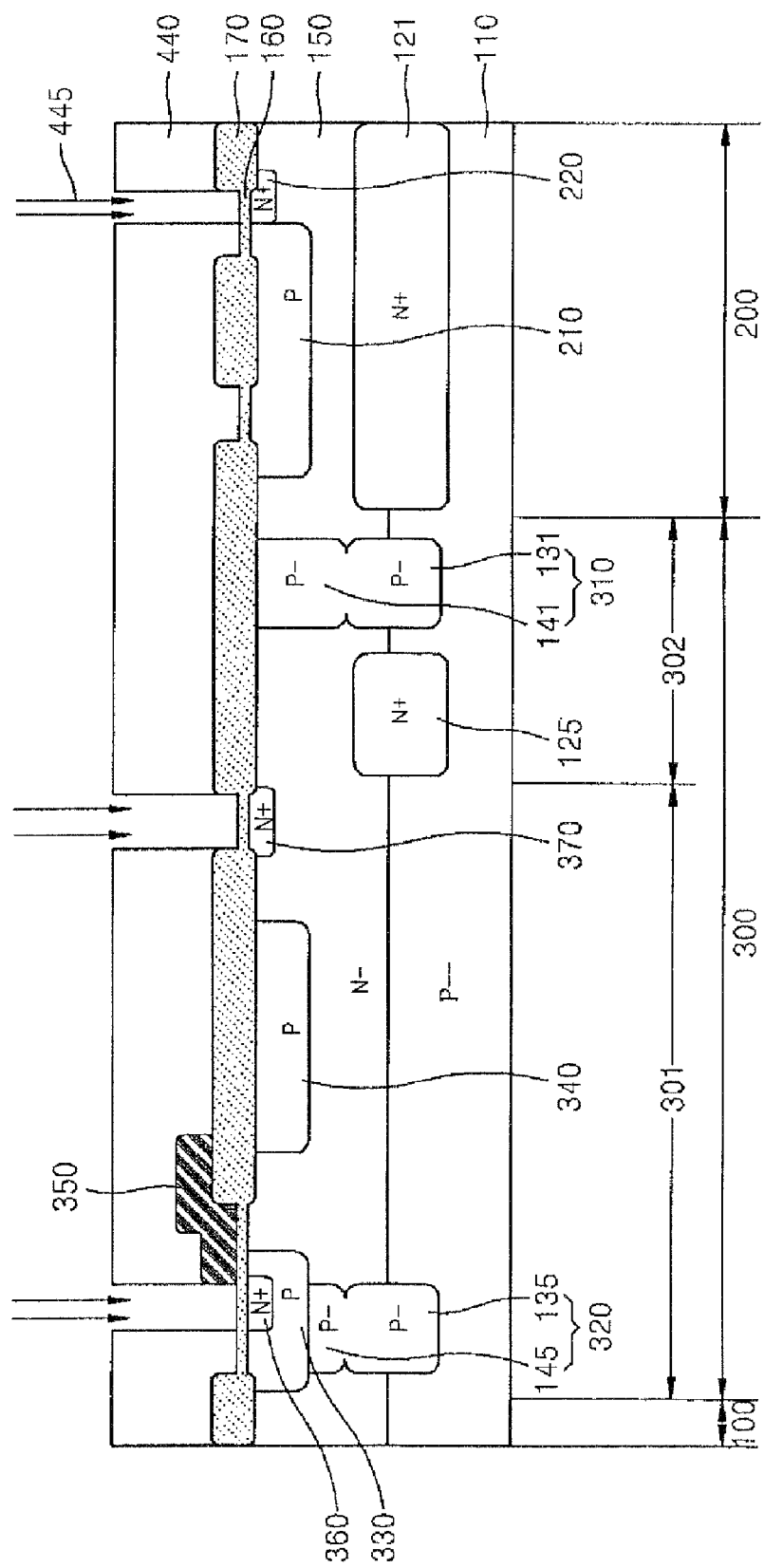
Figure 5G:
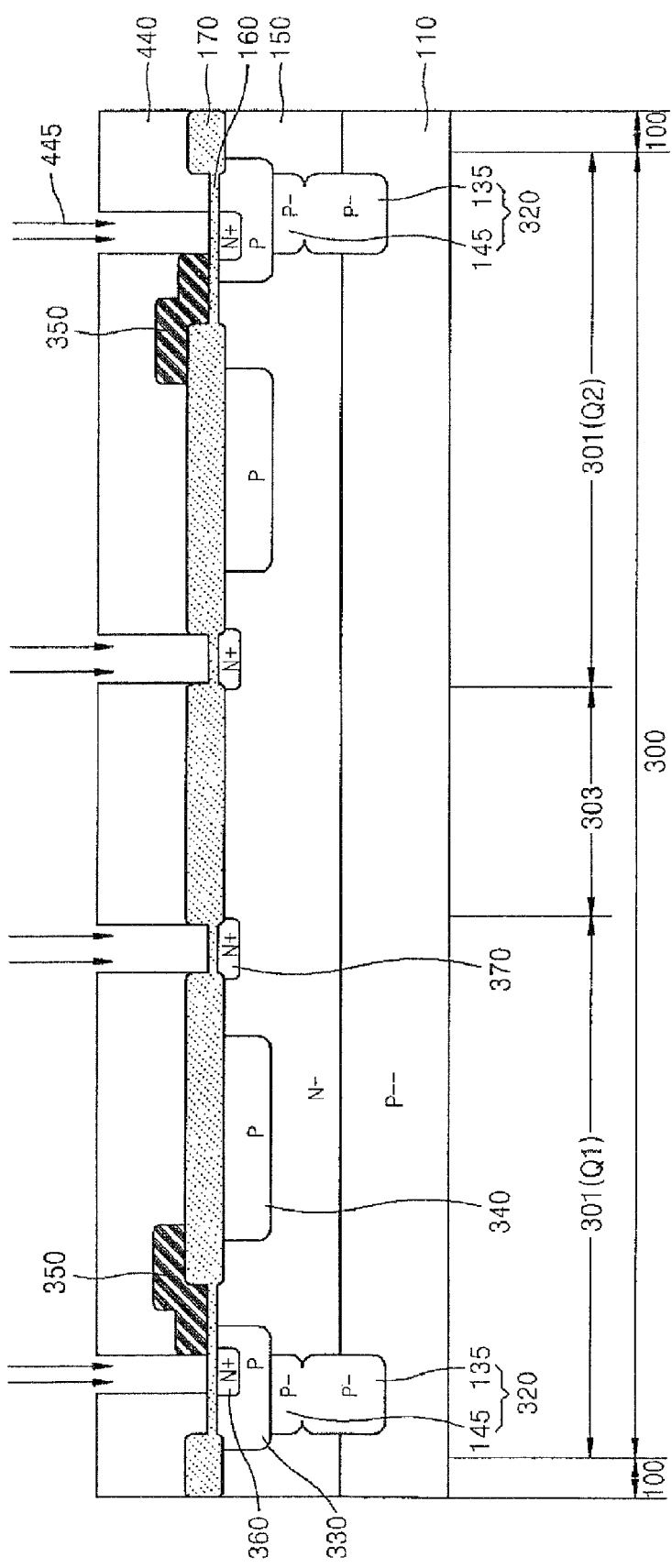

Referring to FIGS. 4G and 5G, a fifth photosensitive layer 440 is formed on the top surface of the P- type semiconductor substrate 110. The fifth photosensitive layer 440 is patterned to expose a portion of the first body region 330, a portion of the epitaxial layer 150 between the second body region 340 and the second buried layer 125 in the device region 301 and a portion of the epitaxial layer 150 adjoined to the third body region 210 in the high voltage unit 200. Second conductivity type high-concentration impurity ions 445 are implanted into the exposed portion of the first body region 330, the exposed portion of the epitaxial layer 150 in the device region 301 and the exposed portion of the epitaxial layer 150 of the high voltage unit 200 using the fifth photosensitive layer 440 as a mask. The N⁺ type source region 360 is formed in the first body region 330, and the N⁺ type drain region 370 is spaced from the source region 360 and is formed in the device region 301. The second body region 340 is arranged between the source region 360 and the drain region 370. In addition, the N⁺ type second contact region 220 which contacts the third body region 210 is formed in the epitaxial layer 150 of the high voltage unit 200.

Figure 4H:
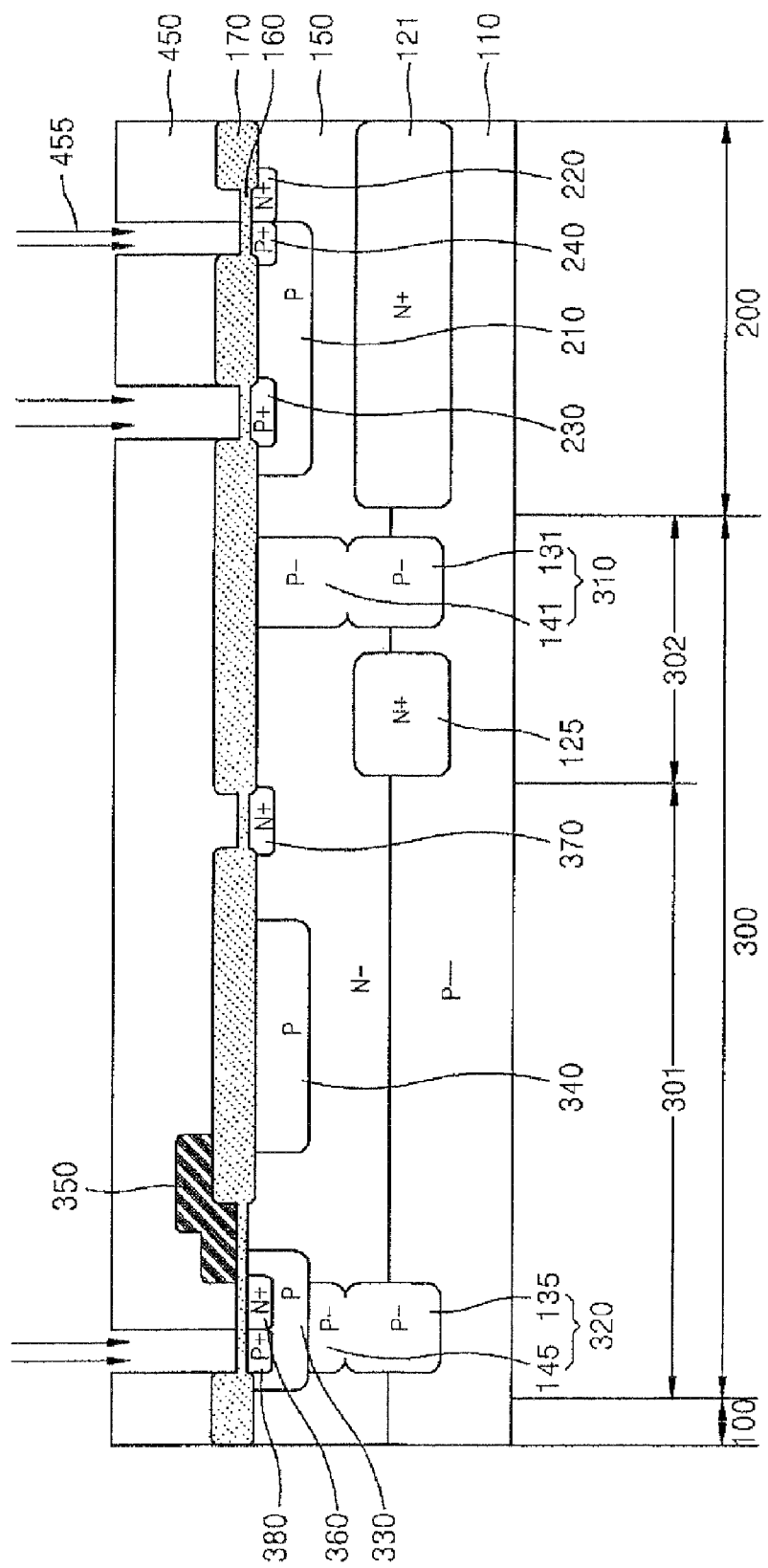
Figure 5H:
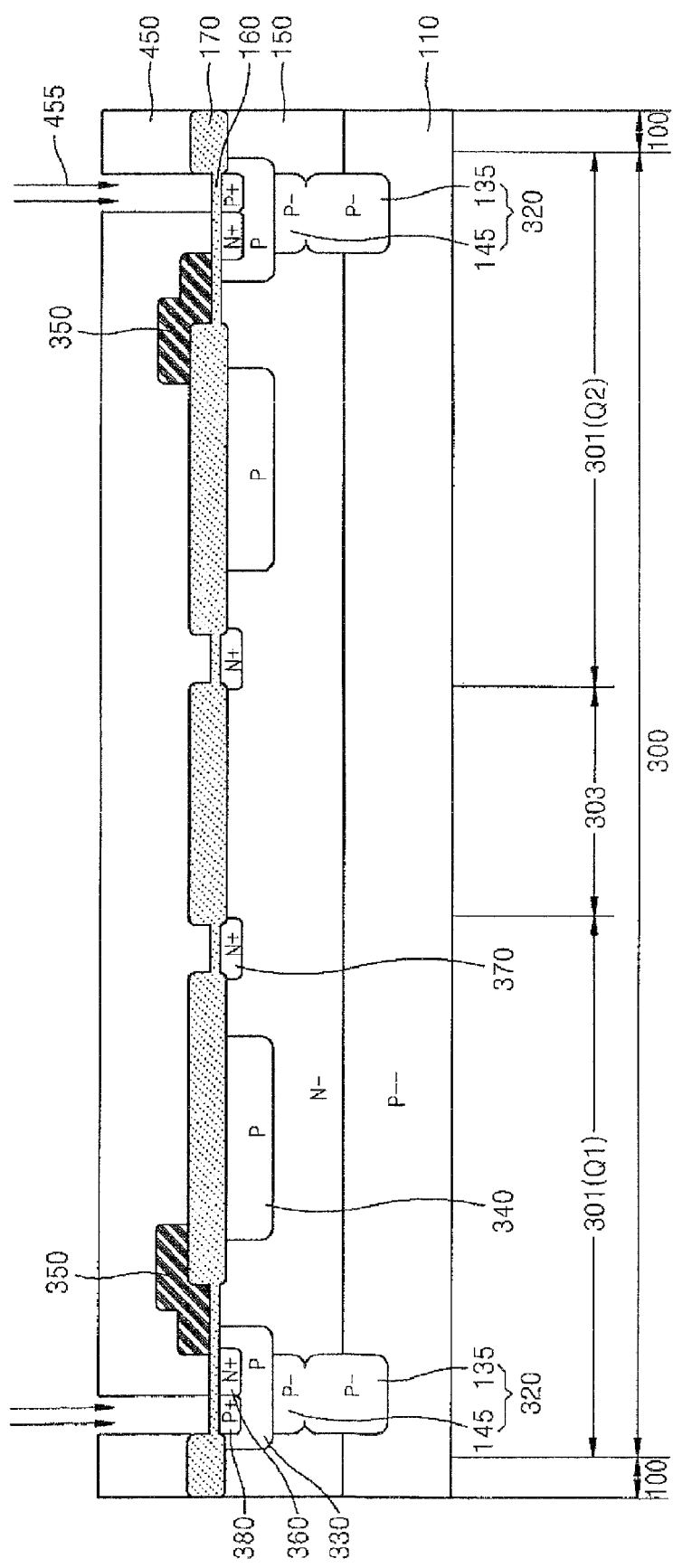

Referring to FIGS. 4H and 5H, the fifth photosensitive layer 440 is removed, and a sixth photosensitive layer 450 is formed on the gate 350, the second insulating layer 160 and the third insulating layer 170. The sixth photosensitive layer 450 may be formed so as to expose a portion of the second insulating layer 160 corresponding to the first body region 330 and portions of the second insulating layer 160 corresponding to the third body region 210. First conductivity type high-concentration impurity ions 455 are implanted into the exposed portion of the first body region 330 and the exposed portions of the third body region 210 by using the sixth photosensitive layer 450 as a mask. Thus, the P⁺ type first contact region 380, which contacts the source region 360, is formed in the first body region 330. The P⁺ type fourth contact region 240, which contacts the second contact region 220, is formed in the third body region 210, and the P+ type third contact region 230, which is spaced from the P⁺ type fourth contact region 240, is formed in the third body region 210.

Figure 4I:
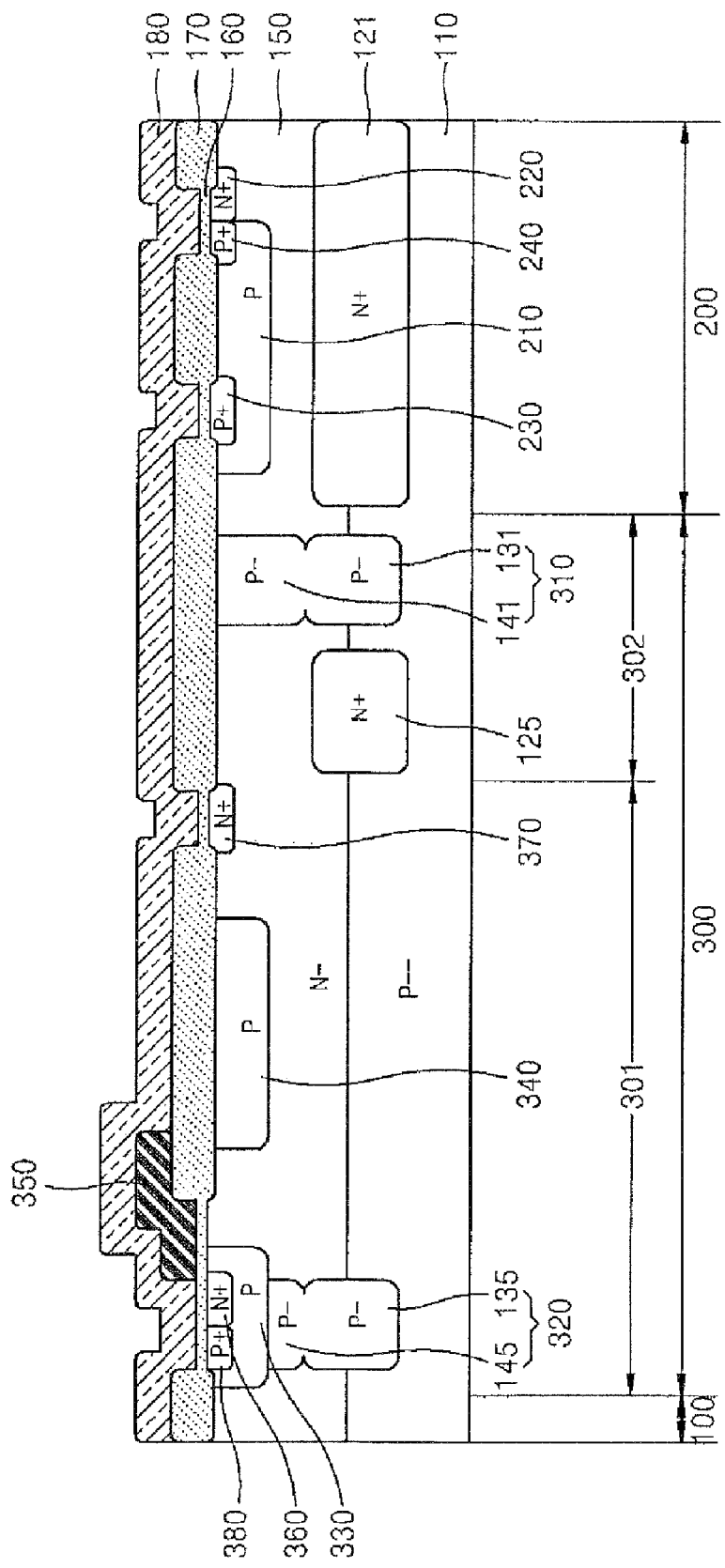
Figure 4J:
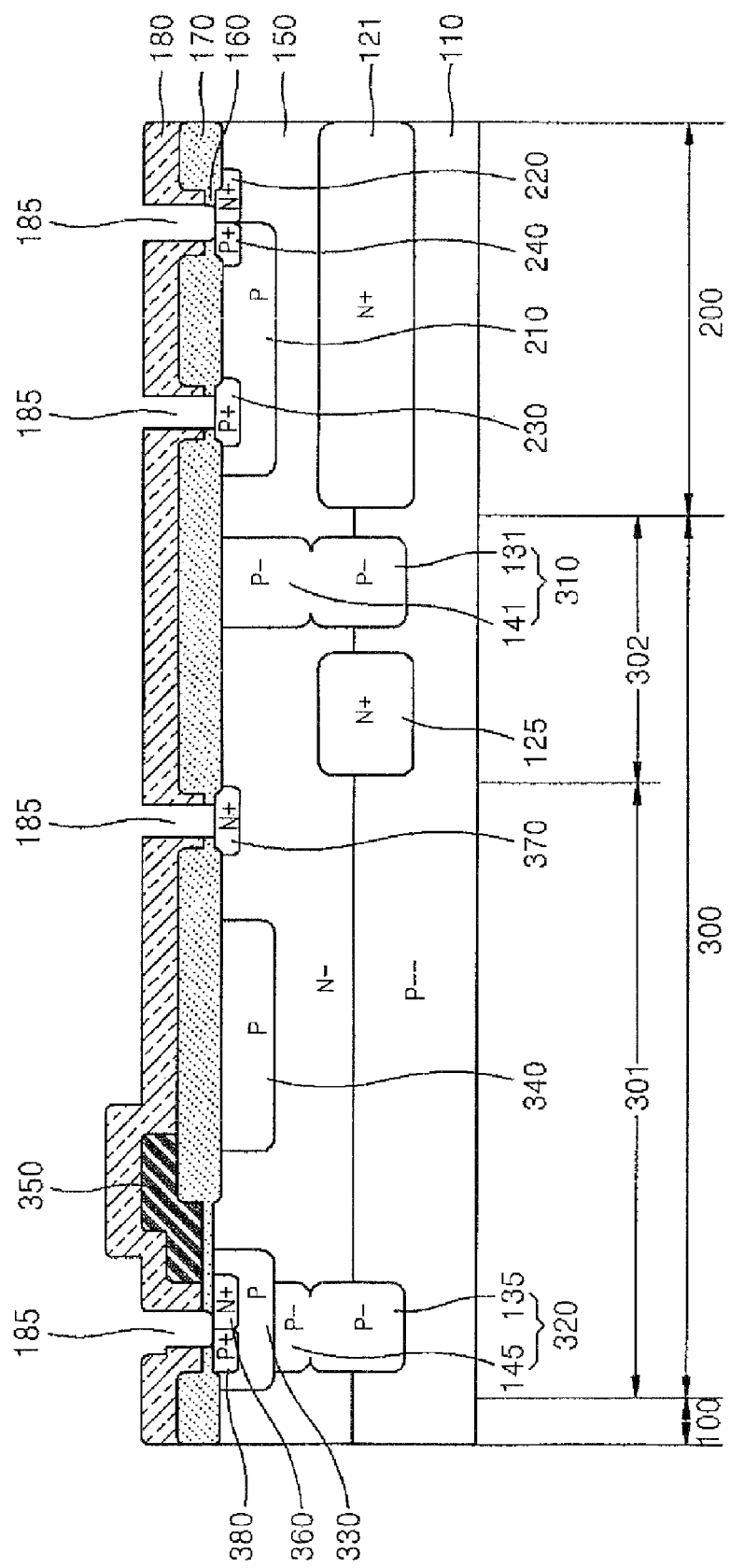
Figure 5J:
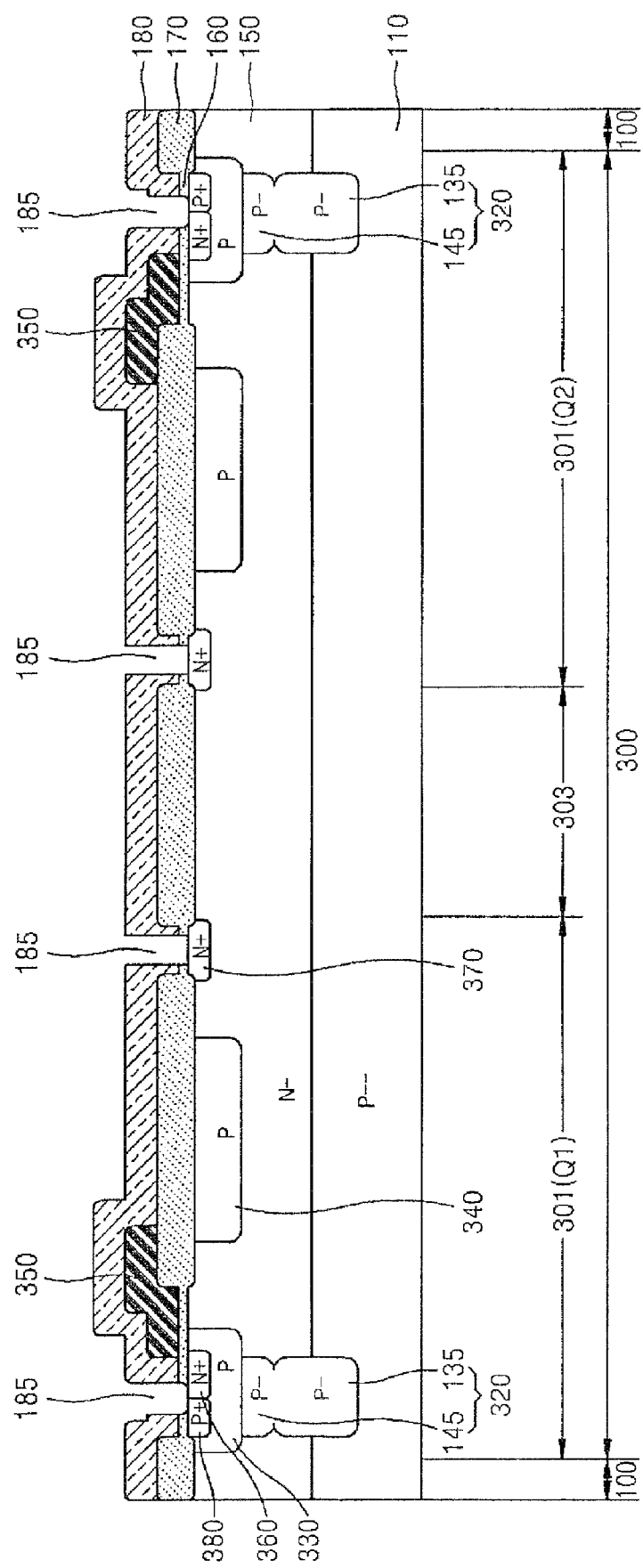

Referring to FIGS. 4I and 5I, the sixth photosensitive layer 450 is removed. The interlayer insulating layer 180 is formed on the top surface of the semiconductor substrate 110. Referring to FIGS. 4J and 5J, the contact holes 185 are formed by etching the interlayer insulating layer 180 and the second insulating layer 160 so as to expose portions of the source region 360, the drain region 370, the first, third, and fourth contact regions 380, 230, and 240 and the N+ type second contact region 220.

Then, as shown in FIGS. 2A and 2B, the source electrode 391, connected to the source region 360 through the contact hole 185, and the drain electrode 395, connected to the drain region 370 through the contact hole 185, are formed on the interlayer insulating layer 180 of the junction termination 300 by metal wiring processes. In addition, the high voltage interconnection 396 which extends from the drain electrode 395 to the third contact region 230 of the high voltage unit 200 is formed on the interlayer insulating layer 180, and the high voltage interconnection electrode 250, connected to the second and fourth contact regions 220 and 240 of the high voltage unit 200, is formed on the interlayer insulating layer 180 of the high voltage unit 200 through the contact hole 185.

According to the high voltage semiconductor device and the method of fabricating the same according to the present invention, the low voltage unit is isolated from the high voltage unit by the junction termination including the LDMOS transistors, and the LDMOS transistors are electrically isolated from the high voltage unit by the P⁻ type device isolation region. Thus, a cross talk between the high voltage unit and the LDMOS transistors can be inhibited, and therefore a reliability of the high voltage semiconductor device can be improved. Since the LDMOS transistors are isolated from the low voltage unit by the device isolation layer and the neighboring LDMOS transistors are connected to each other by a resistor layer, an interference of signals transmitted through the neighboring LDMOS transistors can be inhibited.

In addition, since the resistor region in the high voltage unit is simultaneously formed when the body region is formed in the junction termination, a separate process for forming the resistor in the high voltage unit is not required.

While the present invention has been particularly shown and described with reference to exemplary embodiments thereof, it will be understood by one of ordinary skill in the art that various changes in form and details may be made therein without departing from the spirit and scope of the present invention as defined by the following claims.

What is claimed is:

1. A high voltage semiconductor device comprising level shifters, the device comprising:
 a semiconductor substrate having
 a high voltage unit and
 a low voltage unit surrounding the high voltage unit; and
 a junction termination formed between the high voltage unit and the low voltage unit and surrounding the high voltage unit to electrically isolate the high voltage unit from the low voltage unit,
 wherein the junction termination comprises:
 at least one level shifter which level shifts signals from the low voltage unit and supplies the same to the high voltage unit;
 a first device isolation region surrounding the high voltage unit to electrically isolate the high voltage unit from the level shifter; and
 a resistor layer in the substrate electrically connecting neighboring level shifters.

2. The high voltage semiconductor device of claim 1, wherein the junction termination further comprises semiconductor material doped with first polarity dopants and the isolation region comprises semiconductor material doped with second, opposite polarity dopants.

3. The high voltage semiconductor device of claim 1, wherein the first device isolation region comprises a P⁻ type impurity region.

4. The high voltage semiconductor device of claim 1, wherein the level shifter comprises lateral diffusion metal oxide semiconductor (LDMOS) transistors.

5. The high voltage semiconductor device of claim 4, wherein drains of the neighboring LDMOS transistors are electrically connected to each other through the resistor layer.

6. The high voltage semiconductor device of claim 4, wherein the high voltage unit comprises a resistor region to which a high voltage is applied, wherein the resistor region is electrically connected to the drains of the LDMOS transistors.

7. The high voltage semiconductor device of claim 6, wherein the junction termination further comprises high voltage interconnections which electrically connect the drains of the LDMOS transistors to the resistor region of the high voltage unit.

8. The high voltage semiconductor device of claim 1, wherein the junction termination further comprises a second device isolation region arranged along the interface between the low voltage unit and the junction termination to electrically isolate the low voltage unit from the level shifters.

9. The high voltage semiconductor device of claim 8, wherein the second device isolation region comprises a P⁻ type impurity region.

10. A high voltage semiconductor device comprising a high voltage unit arranged on a first conductivity type semiconductor substrate, a low voltage unit arranged on the substrate to surround the high voltage unit, and a junction termination arranged on the substrate between the high voltage unit and the low voltage unit and comprising at least one level shifter, the device comprising:
 a second conductivity type semiconductor layer arranged on the substrate;
 a first device isolation region arranged in the semiconductor layer to surround the high voltage unit and electrically isolate the high voltage unit from the at least one level shifters;
 at least one first conductivity type first body region arranged in a portion of the junction termination, which contacts the low voltage unit;
 at least one second conductivity type source region arranged in each of the first body regions;
 at least one second conductivity type drain region formed in the semiconductor layer of the junction termination and spaced from each of the source regions;
 at least one first conductivity type second body region formed in the semiconductor layer of the junction termination between each of the first body regions and each of the drain regions; and
 at least one resistor region formed in the semiconductor layer of the high voltage unit.

11. The high voltage semiconductor device of claim 10, wherein the first device isolation region comprises a P⁻ type impurity region.

12. The high voltage semiconductor device of claim 11, wherein the first device isolation region comprises:
 a first bottom region arranged at an interface between the substrate and the semiconductor layer and surrounding the high voltage unit; and
 a first well region formed on the first bottom region to the top surface of the semiconductor layer and surrounding the high voltage unit.

13. The high voltage semiconductor device of claim 12, further comprising a second device isolation region, arranged in the junction termination, along an interface between the low voltage unit and the junction termination so as to electrically isolate the low voltage unit from the at least one level shifters.

14. The high voltage semiconductor device of claim 13, wherein the second device isolation region comprises a P⁻ type impurity region.

15. The high voltage semiconductor device of claim 14, wherein the second device isolation region comprises:
 a second bottom region arranged in an interface between the substrate and the semiconductor layer, along the interface between the low voltage unit and the junction termination; and
 a second well region arranged in the semiconductor layer between the second bottom region and the first body region.

16. The high voltage semiconductor device of claim 11, wherein the at least one resistor region comprises a third body region having the same conductivity types as the first body region and the second body region.

17. The high voltage semiconductor device of claim 16, further comprising:
 at least one first conductivity type source contact region contacting the at least one source region and arranged in the first body region;
 second conductivity type high voltage contact regions contacting the at least one resistor region of the high voltage unit and arranged in the semiconductor layer;
 first conductivity type first resistor contact regions arranged in the third body regions; and
 first conductivity type second resistor contact regions spaced from the first resistor contact regions and arranged in the third body regions.

18. The high voltage semiconductor device of claim 17, further comprising:
 gate insulating layers arranged on the semiconductor layer between the source regions and the first body regions;
 gate electrodes arranged on the gate insulating layers;
 source electrodes electrically connected to the source regions through the source contact regions;
 drain electrodes electrically connected to the drain regions;

high voltage interconnections extending from the drain electrodes to the first resistor contact regions so as to electrically connect the drain regions to the resistor regions; and high voltage electrodes respectively connected to the second resistor contact regions and the high voltage contact regions.

19. The high voltage semiconductor device of claim 18, wherein portions of the semiconductor layer between the neighboring drain regions, functions as a resistor layers electrically connecting the neighboring drain regions.

20. A method of fabricating a high voltage semiconductor device comprising a high voltage unit arranged on a first conductivity type semiconductor substrate, a low voltage unit arranged on the substrate to surround the high voltage unit, and a junction termination arranged on substrate between the high voltage unit and the low voltage unit, the method comprising:

forming a second conductivity type low-concentration semiconductor layer on the substrate;

forming a thin first insulating layer on the semiconductor layer;

forming a first device isolation region in the junction termination to surround the high voltage unit, and a second device isolation region in the junction termination along an interface between the low voltage unit and the junction termination;

forming first conductivity type first body regions arranged on the second device isolation region, first conductivity type second body regions arranged in the semiconductor layer of the junction termination and spaced from the first body regions, and resistor regions having the same conductivity type as those of the first and second body regions in the high voltage unit;

forming a second insulating layer for device isolation on the semiconductor layer, except for portions which the first insulating layer is formed corresponding to portions of the first body regions, portions of the resistor regions and portions of the junction termination and the high voltage unit;

forming gates on the first and second insulating layers so as to overlap the first body regions and the second body regions;

forming second conductivity type high-concentration source regions in the first body region, second conductivity type high-concentration drain regions in the semiconductor layer of the junction termination between the second body regions and the first device isolation region, and second conductivity type high-concentration high voltage contact regions which contact the resistor regions on the semiconductor layer of the high voltage unit; and forming first conductivity type high-concentration source contact regions contacting each of the source regions in the first body region, first conductivity type high-concentration first resistor contact regions in each of the resistor regions, and first conductivity type second resistor contact regions spaced from the first resistor contact regions and arranged in each of the resistor regions so as to contact the high voltage contact regions.

21. The method of claim 20, wherein portions of the semiconductor between the neighboring drain regions, function as a resistor layer electrically connecting the neighboring drain regions.

* * * * *